US010950812B2

(12) United States Patent
Han et al.

(10) Patent No.: US 10,950,812 B2
(45) Date of Patent: Mar. 16, 2021

(54) ORGANIC LIGHT EMITTING DISPLAY DEVICE (OLED) HAVING P-TYPE CHARGE GENERATION LAYER (CGL) FORMED BETWEEN EMISSIONS STACK

(71) Applicant: LG DISPLAY CO., LTD., Seoul (KR)

(72) Inventors: Yoondeok Han, Seoul (KR); JaeMan Lee, Seoul (KR); SoYeon Ahn, Seoul (KR); Heedong Choi, Uiwang (KR); JungSoo Park, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/192,487

(22) Filed: Jun. 24, 2016

(65) Prior Publication Data

US 2017/0155071 A1    Jun. 1, 2017

(30) Foreign Application Priority Data

Nov. 30, 2015  (KR) .................. 10-2015-0168749

(51) Int. Cl.
*H01L 51/50*    (2006.01)
*H01L 27/32*    (2006.01)
*H01L 51/52*    (2006.01)

(52) U.S. Cl.
CPC ........ *H01L 51/5004* (2013.01); *H01L 27/322* (2013.01); *H01L 27/3209* (2013.01); *H01L 27/3246* (2013.01); *H01L 27/3248* (2013.01); *H01L 51/504* (2013.01); *H01L 51/506* (2013.01); *H01L 51/5016* (2013.01);
(Continued)

(58) Field of Classification Search
CPC ............... H01L 51/5004; H01L 51/504; H01L 51/5056; H01L 51/5064; H01L 51/5068
See application file for complete search history.

(56) References Cited

U.S. PATENT DOCUMENTS

2006/0157728 A1    7/2006  Iou
2007/0181887 A1*   8/2007  Kijima ................ H01L 51/5278
                                                             257/79
(Continued)

FOREIGN PATENT DOCUMENTS

EP    2 452 946 A1    5/2012
EP    2 688 370 A1    1/2014
(Continued)

*Primary Examiner* — Anh D Mai
(74) *Attorney, Agent, or Firm* — Birch, Stewart, Kolasch & Birch, LLP

(57) ABSTRACT

Discussed is an organic light emitting display device. The organic light emitting display device can include a first emission part, a second emission part on the first emission part, and a first P-type charge generation layer between the first emission part and the second emission part. The first emission part includes a first hole transport layer, a first emission layer, and a first electron transport layer. The second emission part includes a second hole transport layer, a second emission layer, and a second electron transport layer. The second hole transport layer and the first P-type charge generation layer are disposed adjacent to each other. The second hole transport layer includes a first material and a second material. The first material has an absolute value of a HOMO energy level which can be greater than an absolute value of a LUMO energy level of the first P-type charge generation layer.

30 Claims, 4 Drawing Sheets

(52) U.S. Cl.
CPC ...... *H01L 51/5044* (2013.01); *H01L 51/5056* (2013.01); *H01L 51/5072* (2013.01); *H01L 51/5088* (2013.01); *H01L 51/5278* (2013.01); *H01L 2251/552* (2013.01); *H01L 2251/558* (2013.01)

(56) References Cited

U.S. PATENT DOCUMENTS

| | | | |
|---|---|---|---|
| 2010/0288362 A1* | 11/2010 | Hatwar | ............... H01L 51/5044 |
| | | | 136/263 |
| 2012/0119191 A1 | 5/2012 | Dorok et al. | |
| 2013/0264551 A1 | 10/2013 | Pieh et al. | |
| 2014/0001457 A1 | 1/2014 | Endo | |
| 2014/0183496 A1 | 7/2014 | Heo et al. | |
| 2015/0034923 A1 | 2/2015 | Kim et al. | |
| 2015/0155513 A1* | 6/2015 | Pieh | ................... H01L 27/3209 |
| | | | 257/40 |

FOREIGN PATENT DOCUMENTS

| | | |
|---|---|---|
| EP | 2 833 407 A2 | 2/2015 |
| JP | 2009-283787 A | 12/2009 |

* cited by examiner

US 10,950,812 B2

ORGANIC LIGHT EMITTING DISPLAY DEVICE (OLED) HAVING P-TYPE CHARGE GENERATION LAYER (CGL) FORMED BETWEEN EMISSIONS STACK

CROSS-REFERENCE TO RELATED APPLICATIONS

This application claims the priority benefit of the Korean Patent Application No. 10-2015-0168749 filed on Nov. 30, 2015, which is hereby incorporated by reference as if fully set forth herein.

BACKGROUND OF THE INVENTION

Technical Field

The present disclosure relates to an organic light emitting display device, and more particularly, to an organic light emitting display device in which a driving voltage is reduced and efficiency or lifetime is enhanced.

Discussion of the Related Art

Recently, as society advances to the information-oriented society, the field of display devices which visually express an electrical information signal is rapidly advancing. Various display devices, having excellent performance in terms of thinness, lightness, and low power consumption, are being developed correspondingly.

Examples of the display devices include liquid crystal display (LCD) devices, plasma display panel (PDP) devices, field emission display (FED) devices, organic light emitting display devices, etc.

Particularly, the organic light emitting display devices are self-emitting devices. In comparison with other display devices, the organic light emitting display devices have a fast response time, high emission efficiency, high luminance, and a wide viewing angle and thus are attracting much attention.

SUMMARY OF THE INVENTION

Accordingly, the present disclosure is directed to provide an organic light emitting display device that substantially obviates one or more problems due to limitations and disadvantages of the related art.

Organic light emitting devices are configured in a structure where an anode is formed on a substrate, and a hole transport layer, an emission layer, an electron transport layer, and a cathode are formed on the anode. The hole transport layer, the emission layer, and the electron transport layer are each formed of an organic compound. When a voltage is applied to between the anode and the cathode, a hole injected from the anode moves to the emission layer through the hole transport layer, and an electron injected from the cathode moves to the emission layer through the electron transport layer. The electron and the hole which are carriers are recombined in the emission layer to generate an exciton, and light is emitted when the generated exciton is shifted from an excited state to a ground state. Here, a zone where the electron and the hole are recombined may be referred to as a recombination zone or an emission zone (or an emission area).

Moreover, when an organic light emitting device is configured with two emission parts, the organic light emitting device includes an N-type charge generation layer and a P-type charge generation layer for adjusting a charge balance between the two emission parts. The P-type charge generation layer has a host-dopant structure which includes a host and a P-type dopant. In this case, a process of performing co-deposition by adjusting a concentration of the host and the dopant included in the P-type charge generation layer is needed, but the process causes a time-based deviation between organic layers including the organic light emitting device to degrade reliability of the organic light emitting device. Also, when the P-type charge generation layer is formed of a single material, the hole-injecting characteristic of a hole transport layer adjacent to the P-type charge generation layer is changed, and for this reason, a driving voltage increases, or efficiency or lifetime is reduced. Also, since a P-type dopant material doped on the P-type charge generation layer is expensive, the manufacturing cost of an organic light emitting display device cannot be reduced.

Therefore, the inventors recognize the above-described limitations and have done various experiments for enhancing efficiency or lifetime by adjusting characteristic of a hole transport layer adjacent to the P-type charge generation layer which is configured in a structure including no dopant. Through the various experiments, the inventors have invented an organic light emitting display device having a new structure for enhancing efficiency or lifetime.

An aspect of the present disclosure is directed to provide an organic light emitting display device in which a hole transport layer adjacent to a P-type charge generation layer is configured by a combination of a material, having an absolute value of a lowest unoccupied molecular orbitals (LUMO) energy level which is greater than an absolute value of a LUMO energy level of the P-type charge generation layer, and a material having hole mobility higher than that of the P-type charge generation layer, thereby reducing a driving voltage and enhancing efficiency or lifetime.

Another aspect of the present disclosure is directed to provide an organic light emitting display device in which a hole transport layer adjacent to a P-type charge generation layer is configured by two layers (for example, a layer having high hole mobility and a layer having electron-blocking characteristic), thereby reducing a driving voltage and enhancing efficiency or lifetime.

The objects of the present disclosure are not limited to the aforesaid, but other objects not described herein will be clearly understood by those skilled in the art from descriptions below.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided an organic light emitting display device that includes a first emission part including a first hole transport layer, a first emission layer, and a first electron transport layer, a second emission part on the first emission part, the second emission part including a second hole transport layer, a second emission layer, and a second electron transport layer, and a first P-type charge generation layer between the first emission part and the second emission part, wherein the second hole transport layer and the first P-type charge generation layer are disposed adjacent to each other, and the second hole transport layer includes a first material and a second material, an absolute value of a highest occupied molecular orbitals (HOMO) energy level of the first material being greater than an absolute value of a lowest unoccupied molecular orbitals (LUMO) energy level of the first P-type charge generation layer.

In another aspect of the present disclosure, there is provided an organic light emitting display device that includes a first emission part including a first hole transport layer, a first emission layer, and a first electron transport layer, a second emission part on the first emission part, the second emission part including a second hole transport layer, a second emission layer, and a second electron transport layer, a third emission part on the second emission part, the third emission part including a third hole transport layer, a third emission layer, and a third electron transport layer, a first P-type charge generation layer between the first emission part and the second emission part, and a second P-type charge generation layer between the second emission part and the third emission part, wherein the organic light emitting display device includes a fourth hole transport layer on the third hole transport layer, and an absolute value of a HOMO energy level of the third hole transport layer and an absolute value of a HOMO energy level of the fourth hole transport layer are adjusted to be equal.

Details of the embodiments of the present disclosure are included in the below detailed description and the drawings.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE EMBODIMENTS

Figure 1:
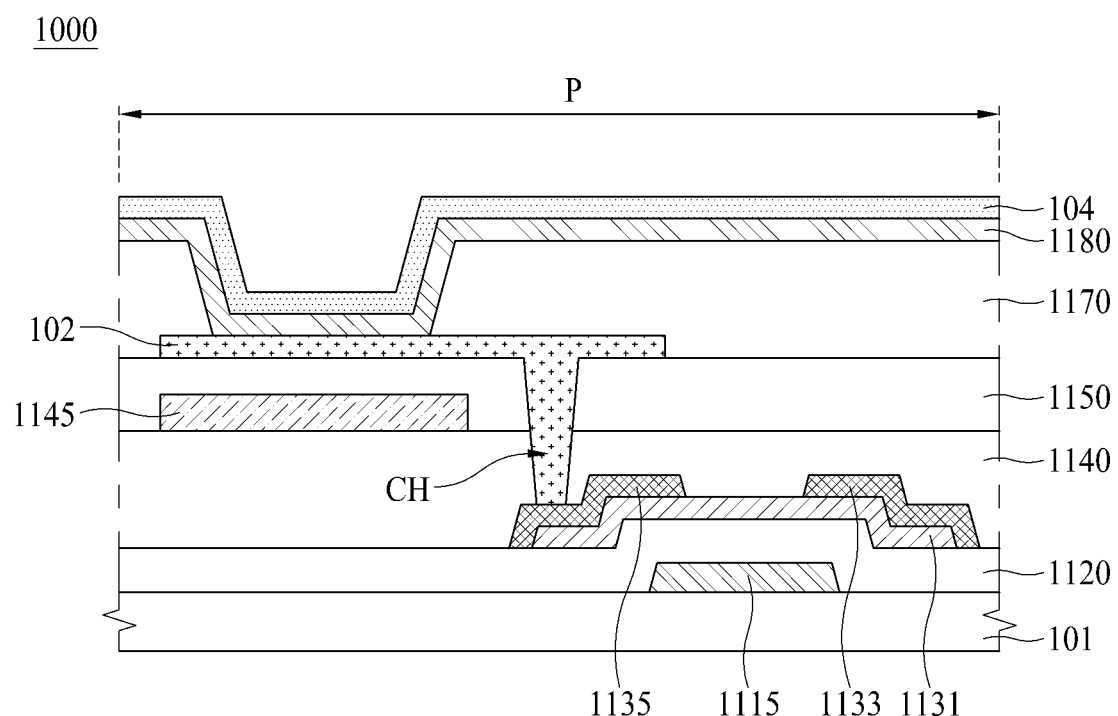
FIG. 1 is a diagram illustrating an organic light emitting display device according to an embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~' one or more other parts may be disposed between the two parts unless 'just' or 'direct' is used.

In describing a time relationship, for example, when the temporal order is described as 'after~', 'subsequent~', 'next~' and 'before~' a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, embodiments of the present disclosure will be described in detail with reference to the accompanying drawings.

FIG. 1 is a diagram illustrating an organic light emitting display device 1000 according to an embodiment of the present disclosure. All the components of the organic light emitting display device according to all embodiments of the present disclosure are operatively coupled and configured.

Referring to FIG. 1, the organic light emitting display device 1000 may include a substrate 101, a first electrode 102, an emission part 1180, and a second electrode 104. The organic light emitting display device 1000 may include a plurality of pixels P. A pixel P denotes an area corresponding to a minimum unit where light is actually emitted, and may be referred to as a subpixel or a pixel area. Also, a certain plurality of pixels P may constitute a minimum group for realizing white light. For example, three pixels may constitute one group, namely, a red pixel, a green pixel, and a blue pixel may constitute one group. Alternatively, four pixels may constitute one group, namely, a red pixel, a green pixel, a blue pixel, and a white pixel may constitute one group. However, the present embodiment is not limited thereto, and various pixel designs may be made. In FIG. 1, for convenience of description and for brevity, only one pixel P is illustrated.

A thin film transistor (TFT) may include a gate electrode 1115, a gate insulation layer 1120, a semiconductor layer 1131, a source electrode 1133, and a drain electrode 1135. The TFT may be disposed on the substrate 101 and may supply a signal to an organic light emitting device that includes the first electrode 102, the emission part 1180, and the second electrode 104. The TFT illustrated in FIG. 1 may be a driving TFT connected to the first electrode 102. A switching TFT or a capacitor for driving the organic light emitting device may be further disposed on the substrate 101. Also, in FIG. 1, the TFT is illustrated as having an inverted staggered structure, but may be formed in other structures such as a coplanar structure.

The substrate 101 may be formed of an insulating material or a material having flexibility. The substrate 101 may be formed of glass, metal, plastic, and/or the like, but is not limited thereto. If an organic light emitting display device is a flexible organic light emitting display device, the substrate 101 may be formed of a flexible material such as plastic and/or the like. Also, if an organic light emitting device which is easy to realize flexibility is applied to a lighting device for vehicles, various designs and a degree of freedom of design of a light device for vehicles are secured according to a structure or an appearance of a vehicle.

The gate electrode 1115 may be formed on the substrate 101 and may be connected to a gate line. The gate electrode 1115 may include a multilayer formed of one material among molybdenum (Mo), aluminum (Al), chromium (Cr), gold (Au), titanium (Ti), nickel (Ni), neodymium (Nd), and copper (Cu) or an alloy thereof.

The gate insulation layer 1120 may be formed on the gate electrode 1115 and may be formed of silicon oxide (SiOx), silicon nitride (SiNx), or a multilayer thereof, but is not limited thereto.

The semiconductor layer 1131 may be formed on the gate insulation layer 1120, and may be formed of amorphous silicon (a-Si), polycrystalline silicon (poly-Si), oxide semiconductor, or organic semiconductor. When the semiconductor layer 1131 is formed of oxide semiconductor, the semiconductor layer 1131 may be formed of indium tin oxide (ITO), indium zinc oxide (IZO), or indium tin zinc oxide (ITZO), but is not limited thereto. Also, an etch stopper may be formed on the semiconductor layer 1131 and may protect the semiconductor layer 1131, but may be omitted depending on a configuration of a device.

The source electrode 1133 and the drain electrode 1135 may be formed on the semiconductor layer 1131. The source electrode 1133 and the drain electrode 1135 may be formed of a single layer or a multilayer, and may be formed of one material among molybdenum (Mo), aluminum (Al), chromium (Cr), gold (Au), titanium (Ti), nickel (Ni), neodymium (Nd), and copper (Cu) or an alloy thereof.

A passivation layer 1140 may be formed on the source electrode 1133 and the drain electrode 1135, and may be formed of SiOx, SiNx, or a multilayer thereof. Alternatively, the passivation layer 1140 may be formed of an acryl resin or a polyimide resin, but is not limited thereto.

A color filter layer 1145 may be formed on the passivation layer 1140, and although only one sub-pixel is illustrated in the drawing, the color filter layer 1145 may be formed in each of a red sub-pixel, a blue sub-pixel, and a green sub-pixel. The color filter layer 1145 may include a red (R) color filter, a green (G) color filter, and a blue (B) color filter which are patterned and formed in respective sub-pixels. The color filter layer 1145 transmits light having only a specific wavelength among white lights emitted from the emission part 1180.

An overcoating layer 1150 may be formed on the color filter layer 1145 and may be formed of an acryl resin, a polyimide resin, SiOx, SiNx, or a multilayer thereof, but is not limited thereto.

The first electrode 102 may be formed on the overcoating layer 1150 and may be formed of indium tin oxide (ITO) or indium zinc oxide (IZO) which is a transparent conductive material such as transparent conductive oxide (TCO), but is not limited thereto. The first electrode 102 may be electrically connected to the drain electrode 1135 through a contact hole CH which is formed in a certain area of the passivation layer 1140 and the overcoating layer 1150. In FIG. 1, the drain electrode 1135 is illustrated as being electrically connected to the first electrode 102, but the present embodiment is not limited thereto. As another example, the source electrode 1133 may be electrically connected to the first electrode 102 through the contact hole CH which is formed in the certain area of the passivation layer 1140 and the overcoating layer 1150.

The organic light emitting display device 1000 of FIG. 1 may be a bottom emission type, light emitted from the emission part 1180 may be transferred in a down direction through the first electrode 102. Also, when the organic light emitting display device 1000 is a top emission type, light emitted from the emission part 1180 may be transferred in an up direction through the second electrode 104.

A bank layer 1170 may be formed on the first electrode 102 and may define a pixel area. The bank layer 1170 may expose a portion of a top of the first electrode 102. The bank layer 1170 may be formed of an organic material such as a benzocyclobutene (BCB) resin, an acryl resin, a polyimide resin, and/or the like. The bank layer 1170 may be formed of a photosensitive material having a black pigment. In this case, the bank layer 1170 may act as a light blocking member.

The emission part 1180 may be formed on the bank layer 1170 and the first electrode 102.

The second electrode 104 may be formed on the emission part 1180 and may be formed of gold (Au), silver (Ag), aluminum (Al), molybdenum (Mo), magnesium (Mg), and/or the like, or may be formed of an alloy thereof. However, the present embodiment is not limited thereto.

Moreover, an encapsulation part may be further formed on the second electrode 104. The encapsulation part prevents moisture from penetrating into the emission part 1180. The encapsulation part may include a plurality of layers where different inorganic materials are stacked, or include a plurality of layers where an inorganic material and an organic material are alternately stacked. Also, an encapsulation substrate may be further formed on the encapsulation part. The encapsulation substrate may be formed of glass, plastic, or metal. The encapsulation substrate may be adhered to the encapsulation part by an adhesive.

Figure 2:
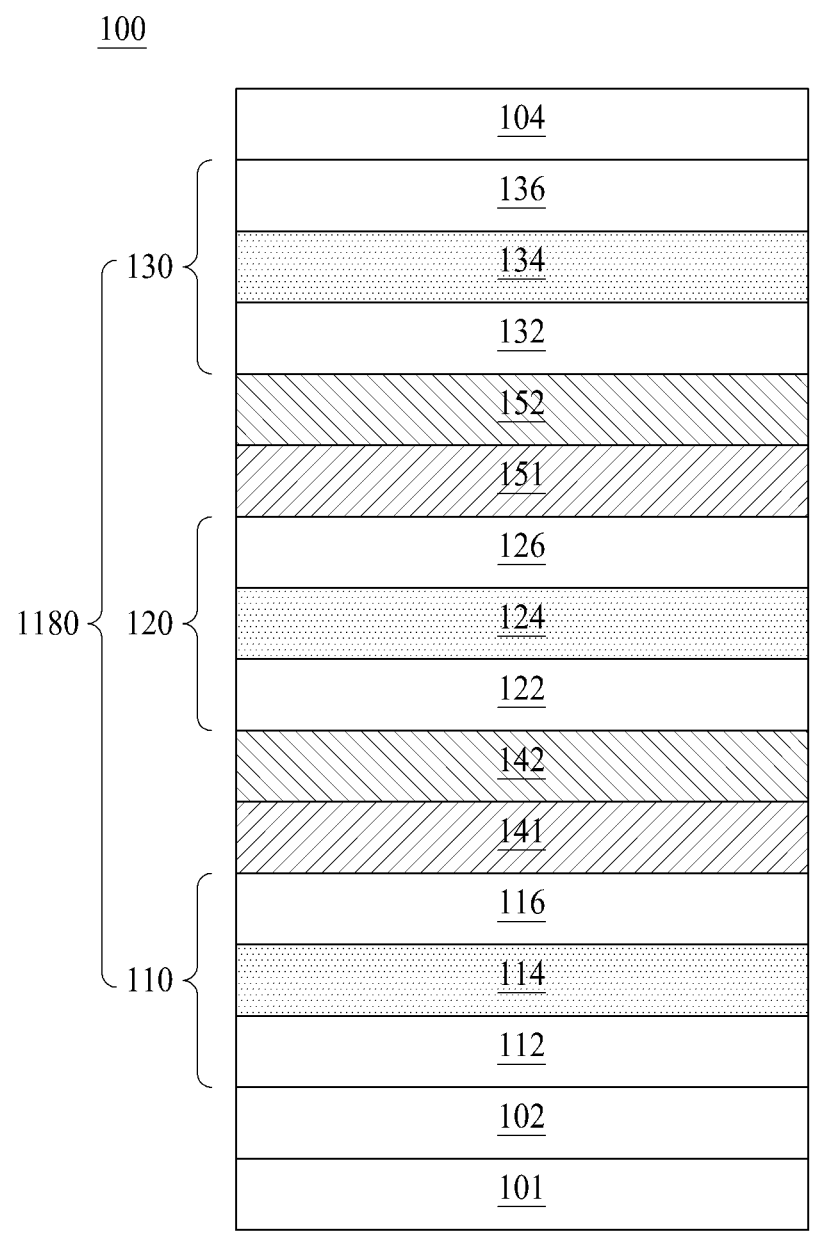
FIG. 2 is a diagram illustrating an organic light emitting device according to a first embodiment of the present disclosure.

FIG. 2 is a diagram illustrating an organic light emitting device 100 according to a first embodiment of the present disclosure.

The organic light emitting device 100 illustrated in FIG. 2 may include a substrate 101, a first electrode 102, a second electrode 104, and an emission part 1180 between the first and second electrodes 102 and 104. The emission part 1180 may include a first emission part 110, a second emission part 120, and a third emission part 130.

The substrate 101 may be formed of an insulating material or a material having flexibility. The substrate 101 may be formed of glass, metal, plastic, and/or the like, but is not limited thereto. If an organic light emitting display device is a flexible organic light emitting display device, the substrate 101 may be formed of a flexible material such as plastic and/or the like. Also, if an organic light emitting device which is easy to realize flexibility is applied to a lighting device for vehicles, various designs and a degree of freedom of design of a light device for vehicles are secured according to a structure or an appearance of a vehicle.

The first electrode 102 is an anode that supplies a hole, and may be formed of indium tin oxide (ITO), indium zinc oxide (IZO), or the like which is a transparent conductive material such as transparent conductive oxide (TCO). However, the present embodiment is not limited thereto.

The second electrode 104 is a cathode that supplies an electron, and may be formed of gold (Au), silver (Ag), aluminum (Al), molybdenum (Mo), magnesium (Mg), and/or the like which is a metal material, or may be formed of an alloy thereof. However, the present embodiment is not limited thereto.

Each of the first electrode 102 and the second electrode 104 may be referred to as an anode or a cathode. Alternatively, the first electrode 102 may be formed as a semi-transmissive electrode, and the second electrode 104 may be formed as a reflective electrode. Alternatively, the first electrode 102 may be formed as a reflective electrode, and the second electrode 104 may be formed as a semi-transmissive electrode.

The first emission part 110 may include a first hole transport layer (HTL) 112, a first emission layer (EML) 114, and a first electron transport layer (ETL) 116 which are disposed on the first electrode 102.

A hole injection layer (HIL) may be further formed on the first electrode 102. The HIL may smoothly inject a hole, supplied from the first electrode 102, into the first EML 114.

The first HTL 112 may supply a hole, supplied through the HIL, to the first EML 114. The first ETL 116 may supply an electron, supplied from the second electrode 104, to the first EML 114. Therefore, the hole supplied through the first HTL 112 and the electron supplied through the first ETL 116 may be recombined in the first EML 114 to generate an exciton. A zone where the exciton is generated may be referred to as a recombination zone (or recombination area) or an emission zone (or an emission area).

The first HTL 112 may be configured with a single layer or two layers.

The first ETL 116 may be formed of two or more layers or two or more materials. An electron injection layer (EIL) may be further formed on the first ETL 116.

A hole blocking layer (HBL) may be further formed on the first EML 114. The HBL prevents a hole, injected into the first EML 114, from being transferred to the first ETL 116 and thus enhances a combination of an electron and a hole in the first EML 114, thereby enhancing the emission efficiency of the first EML 114. The first ETL 116 and the HBL may be provided as one layer. Also, the first ETL 116, the HBL, and the EIL may each be referred to as an electron transfer layer. For example, the electron transfer layer may be a layer for injecting or transferring an electron to the emission layer.

An electron blocking layer (EBL) may be further formed under the first EML 114. The EBL prevents an electron, injected into the first EML 114, from being transferred to the first HTL 112 and thus enhances a combination of an electron and a hole in the first EML 114, thereby enhancing the emission efficiency of the first EML 114. The first HTL 112 and the EBL may be provided as one layer. Also, the first HTL 112, the EBL, and the HIL may each be referred to as a hole transfer layer. For example, the hole transfer layer may be a layer for injecting or transferring a hole to the emission layer.

The first EML 114 may be an EML emitting light of a first color. For example, the first EML 114 may include one among a blue EML, a deep blue EML, and a sky blue EML. An emission zone of the first EML 114 may be within a range of 440 nm to 480 nm.

The first EML 114 may be formed of a blue EML which includes an auxiliary EML emitting light having a color different from that of light emitted from the blue EML. The auxiliary EML may be configured with one among a yellow-green EML and a red EML, or may be configured by a combination thereof. When the auxiliary EML is further provided, green or red efficiency can be further enhanced. When the first EML 114 is provided along with the auxiliary EML, the yellow-green EML, the red EML, or a green EML may be disposed on or under the first EML 114. Also, the yellow-green EML, the red EML, or the green EML may be identically or differently provided as the auxiliary EML on and under the first EML 114. The positions or number of EMLs may be selectively determined depending on a structure and a characteristic of a device, but the present embodiment is not limited thereto. When the first EML 114 includes the auxiliary EML, an emission zone of the first EML 114 may be within a range of 440 nm to 650 nm.

The first HTL 112, the first EML 114, the first ETL 116, the EIL, the HIL, the HBL, and the EBL which configure the first emission part 110 may each be referred to as an organic layer.

The first EML 114 may include at least one host and dopant. Alternatively, the first EML 114 may include a mixed host, where at least two or more hosts are mixed, and at least one dopant. The mixed host may include a host having hole-transporting characteristic and a host having electron-transporting characteristic.

The second emission part 120 may include a second HTL 122, a second EML 124, and a second ETL 126.

An EIL may be further formed on the second ETL 126. Also, the second ETL 126 may be formed of two or more layers or two or more materials.

A hole blocking layer (HBL) may be further formed on the second EML 124. The HBL prevents a hole, injected into the second EML 124, from being transferred to the second ETL 126 and thus enhances a combination of an electron and a hole in the second EML 124, thereby enhancing the emission efficiency of the second EML 124. The second ETL 126 and the HBL may be provided as one layer. Also, the second ETL 126, the HBL, and the EIL may each be referred to as an electron transfer layer. For example, the electron transfer layer may be a layer for injecting or transferring an electron to the emission layer.

The second HTL 122 and the HIL may each be referred to as a hole transfer layer. For example, the hole transfer layer may be a layer for injecting or transferring a hole to the emission layer.

A hole supplied through the second HTL 122 and an electron supplied through the second ETL 126 may be recombined in the second EML 124 to generate an exciton. A zone where the exciton is generated may be referred to as a recombination zone (or a recombination area) or an emission zone (or an emission area).

The second EML 124 may be an EML emitting light of a second color. For example, the second EML 124 may include a yellow-green EML or a green EML. An emission zone of the second EML 124 may be within a range of 510 nm to 590 nm.

The second EML 124 may include a yellow-green EML and a red EML, a green EML and red EML, or a combination thereof. The combination thereof may include a yellow-green EML, a red EML, and a yellow-green EML or may include a yellow-green EML, a red EML, and a green EML, but is not limited thereto. Also, when a red EML is further formed, red efficiency is further enhanced. When the red EML is further formed, the red EML may be formed on or under a yellow-green EML or a green EML. The positions or number of EMLs may be selectively determined depending on a structure and a characteristic of a device, but the present embodiment is not limited thereto. When the red EML is further provided in the second EML 124, an emission zone of the second EML 124 may be within a range of 510 nm to 650 nm.

The second EML 124 may include at least one host and dopant. Alternatively, the second EML 124 may include a mixed host, where at least two or more hosts are mixed, and at least one dopant. The mixed host may include a host having hole-transporting characteristic and a host having electron-transporting characteristic.

The second HTL 122, the second EML 124, the second ETL 126, the EIL, the HIL, the HBL, and the EBL which configure the second emission part 120 may each be referred to as an organic layer.

A first charge generation layer (CGL) may be further provided between the first emission part 110 and the second emission part 120. The first CGL may adjust a charge balance between the first emission part 110 and the second emission part 120. The first CGL may include a first N-type CGL 141 and a first P-type CGL 142.

The first N-type CGL 141 may inject an electron into the first emission part 110. The first P-type CGL 142 may inject a hole into the second emission part 120.

The first N-type CGL 141 may be formed as an organic layer which is formed by doping a host with alkali metal such as lithium (Li), sodium (Na), potassium (K), or cesium (Cs) or alkali earth metal such as magnesium (Mg), strontium (Sr), barium (Ba), or radium (Ra), but is not limited thereto.

The first P-type CGL 142 may be formed in a structure including no dopant.

The third emission part 130 may include a third HTL 132, a third EML 134, and a third ETL 136 which are disposed on the second emission part 120.

An EIL may be further formed on the third ETL 136. Also, the third ETL 136 may be formed of two or more layers or two or more materials. Also, an HIL may be further formed under the third HTL 132.

An HBL may be further formed on the third EML 134. The HBL prevents a hole, injected into the third EML 134, from being transferred to the third ETL 136 and thus enhances a combination of an electron and a hole in the third EML 134, thereby enhancing the emission efficiency of the third EML 134. The third ETL 136 and the HBL may be provided as one layer. Also, the third ETL 136, the HBL, and the EIL may each be referred to as an electron transfer layer. For example, the electron transfer layer may be a layer for injecting or transferring an electron to the emission layer.

An EBL may be further formed under the third EML 134. The EBL prevents an electron, injected into the third EML 134, from being transferred to the third HTL 132 and thus enhances a combination of an electron and a hole in the third EML 134, thereby enhancing the emission efficiency of the third EML 134. The third HTL 132 and the EBL may be provided as one layer. Also, the third HTL 132, the EBL, and the HIL may each be referred to as a hole transfer layer. For example, the hole transfer layer may be a layer for injecting or transferring a hole to the emission layer.

A hole supplied through the third HTL 132 and an electron supplied through the third ETL 136 may be recombined in the third EML 134 to generate an exciton. A zone where the exciton is generated may be referred to as a recombination zone (or recombination area) or an emission zone (or an emission area).

The third EML 134 may be an EML emitting light having the same color as the first color. That is, the third EML 134 may include one among a blue EML, a deep blue EML, and a sky blue EML. An emission zone of the third EML 134 may be within a range of 440 nm to 480 nm.

The third EML 134 may be formed of a blue EML which includes an auxiliary EML emitting light having a color different from that of light emitted from the blue EML. The auxiliary EML may be configured with one among a yellow-green EML and a red EML, or may be configured by a combination thereof. When the auxiliary EML is further provided, green or red efficiency can be further enhanced. When the third EML 134 is provided along with the auxiliary EML, the yellow-green EML, the red EML, or a green EML may be disposed on or under the third EML 134. Also, the yellow-green EML, the red EML, or the green EML may be identically or differently provided as the auxiliary EML on and under the third EML 134. The positions or number of EMLs may be selectively determined depending on a structure and a characteristic of a device, but the present embodiment is not limited thereto. When the third EML 134 includes the auxiliary EML, an emission zone of the third EML 134 may be within a range of 440 nm to 650 nm.

The third HTL 132, the third EML 134, the third ETL 136, the EIL, the HIL, the HBL, and the EBL which configure the third emission part 130 may each be referred to as an organic layer.

The third EML 134 may include at least one host and dopant. Alternatively, the third EML 134 may include a mixed host, where at least two or more hosts are mixed, and at least one dopant. The mixed host may include a host having hole-transporting characteristic and a host having electron-transporting characteristic.

A second CGL may be further provided between the second emission part 120 and the third emission part 130. The second CGL may adjust a charge balance between the second emission part 120 and the third emission part 130. The second CGL may include a second N-type CGL 151 and a second P-type CGL 152.

The second N-type CGL 151 may inject an electron into the second emission part 120. The second P-type CGL 152 may inject a hole into the third emission part 130.

The second N-type CGL 151 may be formed as an organic layer doped with alkali metal such as lithium (Li), sodium (Na), potassium (K), or cesium (Cs) or alkali earth metal such as magnesium (Mg), strontium (Sr), barium (Ba), or radium (Ra), but is not limited thereto. The second P-type CGL 152 may be formed in a host-dopant structure including a P-type dopant.

Therefore, the inventors have experimented on a case where the first P-type CGL 142 is formed in a structure including no dopant, and the second HTL 122 is provided. A result of the experiment will be described below with reference to the following Table 1.

TABLE 1

| Division | Driving Voltage (V) | Efficiency (cd/A) | EQE |
| --- | --- | --- | --- |
| Comparative Example 1 | 100.0% | 100.0% | 100.0% |
| Experiment Example 1 | 99.2% | 75.0% | 84.3% |

Table 1 shows a result obtained by comparing an experiment example 1, with a comparative example 1 where the driving voltage (V), the efficiency (cd/A), and the external quantum efficiency (EQE) are each set to 100.0%. Also, the driving voltage (V), the efficiency (cd/A), and the external quantum efficiency (EQE) have been measured with respect to a current density of 10 mA/cm$^2$. The comparative example 1 and the experiment example 1 shown in Table 1 have been measured by using an organic light emitting display device including the organic light emitting device of FIG. 2.

In Table 1, in the comparative example 1, the first P-type CGL 142 including a host and a P-type dopant and the second HTL 122 are provided. In the experiment example 1, the first P-type CGL 142 including no dopant and the second HTL 122 are provided.

To describe the driving voltage (V), it can be seen that in the driving voltage (V), the experiment example 1 is reduced by about 0.8% in comparison with the comparative example 1. Also, it can be seen that in the efficiency (cd/A), the experiment example 1 is reduced by about 25.0% in comparison with the comparative example 1. The external quantum efficiency (EQE) denotes emission efficiency of when light is output to outside the organic light emitting device, and it can be seen that in the emission efficiency, the experiment example 1 is reduced by about 15.7% in comparison with the comparative example 1. Therefore, it can be seen that when the first P-type CGL including no dopant is provided, the driving voltage is reduced a little, or the efficiency or the external quantum efficiency is much reduced. Through this, it can be seen that when the first P-type CGL including no dopant is provided, characteristics of the second HTL should be improved.

Therefore, since the first P-type CGL 142 does not include 2,3,5,6-tetrafluoro-7,7,8,8-tetracyano-quinodimethane (F4-TCNQ), Hexaazatriphenylene-hexacarbonitrile (HAT-CN), and/or the like which is a dopant, the inventors have recognized that an HTL having an absolute value of a highest occupied molecular orbitals (HOMO) energy level which is small in difference with an absolute value of a LUMO energy level of the first P-type CGL 142 is provided for enhancing efficiency. When an HTL having an absolute value of a HOMO energy level which is large in difference with the absolute value of the LUMO energy level of the first P-type CGL 142 is provided, it is difficult for a hole of the first P-type CGL 142 to move to the second EML 124, and thus, a voltage of the organic light emitting device increases, or an efficiency of the organic light emitting device is reduced. Also, the inventors have recognized that a hole mobility of the second HTL 122 should be improved in order for a hole to easily move from the first P-type CGL 142 to the second HTL 122.

Therefore, in order to lower the driving voltage and enhance efficiency, the second HTL 122 is formed of first and second materials having two kinds of characteristics, and the first and second materials are mixed through co-deposition. Therefore, when the second HTL 122 is configured with two layers, the driving voltage is prevented from increasing because a thickness of the second HTL 122 is thickened, and emission efficiency is prevented from being reduced because an emission position of the second EML 124 is changed. A thickness of the second HTL 122 may be within a range of 5 nm to 10 nm. When a thickness of the second HTL 122 is adjusted to be less than 5 nm, the second HTL 122 cannot function, and for this reason, it is difficult for a hole of the first P-type CGL 142 to move to the second EML 124, thereby increasing the driving voltage and reducing efficiency. Also, when a thickness of the second HTL 122 is adjusted to be more than 5 nm, a thickness of the organic light emitting device is thickened, causing an increase in the driving voltage. Also, the first material and the second material included in the second HTL 122 may be configured at an equal ratio. That is, in the second HTL 122, a ratio of the first material to the second material may be 5:5 in volume ratio. Here, the volume ratio denotes a volume of a portion occupied by a certain material in a certain layer, and the volume ratio may be based on a sum of occupied volumes.

Therefore, in the first material of the second HTL 122, an absolute value of a HOMO energy level of the second HTL 122 may be adjusted to be greater than an absolute value of a LUMO energy level of the first P-type CGL 142 so that a barrier is not formed when a hole of the first P-type CGL 142 moves to the second HTL 122. That is, the absolute value of the HOMO energy level of the second HTL 122 may be within a range of 5.4 eV to 5.6 eV, and the absolute value of the LUMO energy level of the first P-type CGL 142 may be within a range of 5.3 eV to 5.5 eV. Also, a difference between the absolute value of the HOMO energy level of the second HTL 122 and the absolute value of the LUMO energy level of the first P-type CGL 142 may be within a range of 0.1 eV to 0.3 eV. In a case where the difference between the absolute value of the HOMO energy level of the second HTL 122 and the absolute value of the LUMO energy level of the first P-type CGL 142 is more than 0.3 eV, since it is difficult for a hole of the first P-type CGL 142 to move to the second HTL 122, the driving voltage increases, and the emission efficiency of the second EML 124 is reduced. Therefore, the absolute value of the HOMO energy level of the second HTL 122 and the absolute value of the LUMO energy level of the first P-type CGL 142 may have a similar energy level within a range of 0.1 eV to 0.3 eV. Accordingly, a hole of the first P-type CGL 142 may move to the second HTL 122, and a hole of the second HTL 122 may move to the second EML 124.

Moreover, the second material of the second HTL 122 may be formed of a material which is high in hole mobility, and thus enables a hole to easily move to the second EML 124. A hole mobility of the second material may be about 10 times higher than that of a general HTL. For example, the hole mobility of the second material may be within a range of $1\times10^{-2}$ cm$^2$/Vs to $1\times10^{-4}$ cm$^2$/Vs.

The first P-type CGL 142 may be formed of a material having hole-transporting characteristic, for example, one among N,N'-bis(naphthalene-1-yl)-N,N'-bis(phenyl)-2,2'-dimethylbenzidine (NPD), N,N'-bis(naphthalene-1-yl)-N,N'-bis(phenyl)-benzidine (NPB), N,N'-bis-(3-methylphenyl)-N,N'-bis(phenyl)-benzidine (TPD), and 4,4',4-Tris(N-3-methylphenyl-N-phenyl-amino)-triphenylamine (MTDATA), but is not limited thereto.

Moreover, the first and second materials of the second HTL 122 may include, for example, a starburst amine group, an aromatic amine group, and/or the like, but is not limited thereto.

A result, obtained by measuring a driving voltage, efficiency, and external quantum efficiency according to a first embodiment of the present disclosure to which a P-type CGL including no dopant and an HTL including a combination of two materials are applied, will be described below with reference to the following Table 2.

TABLE 2

| Division | Driving Voltage (V) | Efficiency (cd/A) | EQE |
| --- | --- | --- | --- |
| Comparative Example 1 | 100.0% | 100.0% | 100.0% |
| First Embodiment | 90.8% | 99.9% | 100.3% |

Table 2 shows a result obtained by comparing the first embodiment, with the comparative example 1 where the driving voltage (V), the efficiency (cd/A), and the external quantum efficiency (EQE) are each set to 100.0%. Also, the driving voltage (V), the efficiency (cd/A), and the external quantum efficiency (EQE) have been measured with respect to a current density of 10 mA/cm$^2$. The first embodiment and the comparative example 1 shown in Table 2 have been measured by using an organic light emitting display device including the organic light emitting device of FIG. 2.

In Table 2, in the comparative example 1, the first P-type CGL 142 including a host and a P-type dopant and the second HTL 122 are provided. In the first embodiment, the first P-type CGL 142 including no dopant and the second HTL 122 including a combination of two materials are provided.

To describe the driving voltage (V), it can be seen that in the driving voltage (V), the first embodiment is reduced by about 9.2% in comparison with the comparative example 1. Therefore, it can be seen that even when the first P-type CGL 142 including no dopant is provided, the driving voltage does not increase. When a difference between an absolute value of a LUMO energy level of the first P-type CGL 142 and an absolute value of a HOMO energy level of the second HTL 122 is adjusted to be a small value, it can be seen that a hole moves from the first P-type CGL 142 to the second HTL 122. Also, one among the two materials of the second HTL 122 is high in hole mobility, and thus, it can be seen that the hole moves from the first P-type CGL 142 to the second HTL 122, and thus, the driving voltage does not increase.

Moreover, it can be seen that in the efficiency (cd/A), the first embodiment of the present disclosure is almost equal to the comparative example 1. Also, it can be seen that in the external quantum efficiency (EQE), the first embodiment of the present disclosure is enhanced by about 0.3% in comparison with the comparative example 1.

Therefore, the first embodiment of the present disclosure may provide an organic light emitting display device in which a driving voltage is reduced, and efficiency or external quantum efficiency is not reduced, in comparison with a case where a P-type CGL having a host-dopant structure and an HTL formed of a single layer are provided. That is, a P-type CGL including no dopant and an HTL including a combination of two materials are provided, a difference between an absolute value of a LUMO energy level of the P-type CGL and an absolute value of a HOMO energy level of an HTL adjacent to the P-type CGL is adjusted to be a small value, and one among the two materials of the HTL is high in hole mobility, thereby providing an organic light emitting display device in which a driving voltage is reduced, and efficiency or external quantum efficiency is not reduced.

A result, data obtained by measuring a driving voltage, efficiency, and external quantum efficiency according to an experiment example 1 and a first embodiment of the present disclosure, will be described below with reference to the following Table 3.

TABLE 3

| Division | Driving Voltage (V) | Efficiency (cd/A) | EQE |
| --- | --- | --- | --- |
| Experiment Example 1 | 100.0% | 100.0% | 100.0% |
| First Embodiment | 94.8% | 133.2% | 119.0% |

Table 3 shows a result obtained by comparing the first embodiment, with the experiment example 1 where the driving voltage (V), the efficiency (cd/A), and the external quantum efficiency (EQE) are each set to 100.0%. Also, the driving voltage (V), the efficiency (cd/A), and the external quantum efficiency (EQE) have been measured with respect to a current density of 10 mA/cm$^2$. The first embodiment and the experiment example 1 shown in Table 3 have been measured by using an organic light emitting display device including the organic light emitting device of FIG. 2.

In Table 3, in the experiment example 1, the first P-type CGL 142 including no dopant and the second HTL 122 are provided. In the first embodiment of the present disclosure, the first P-type CGL 142 including no dopant and the second HTL 122 including a combination of two materials are provided.

To describe the driving voltage (V), it can be seen that in the driving voltage (V), the first embodiment of the present disclosure is reduced by about 5.2% in comparison with the experiment example 1. Therefore, it can be seen that when the first P-type CGL 142 including no dopant is provided, a hole does not move to the second HTL 122, and thus, the driving voltage does not increase. That is, a difference between an absolute value of a LUMO energy level of the first P-type CGL 142 and an absolute value of a HOMO energy level of one among two materials of the second HTL 122 is adjusted to be a small value, and thus, it can be seen that the hole moves from the first P-type CGL 142 to the second HTL 122. Also, one among the two materials of the second HTL 122 is high in hole mobility, and thus, it can be seen that the hole moves from the first P-type CGL 142 to the second HTL 122, and thus, the driving voltage does not increase.

Moreover, it can be seen that in the efficiency (cd/A), the first embodiment of the present disclosure is enhanced by about 33.2% in comparison with the experiment example 1. Also, it can be seen that in the external quantum efficiency (EQE), the first embodiment of the present disclosure is enhanced by about 19.0% in comparison with the experiment example 1.

Therefore, the first embodiment of the present disclosure may provide an organic light emitting display device in which a driving voltage is reduced, and efficiency or external quantum efficiency is not reduced, in comparison with a case where a P-type CGL including no dopant and an HTL formed of a single layer are provided. That is, a P-type CGL including no dopant and an HTL including a combination of two materials are provided, a difference between an absolute value of a LUMO energy level of the P-type CGL and an absolute value of a HOMO energy level of an HTL adjacent to the P-type CGL is adjusted to be a small value, and one among the two materials of the HTL is high in hole mobility, thereby providing an organic light emitting display device in which a driving voltage is reduced, and efficiency or external quantum efficiency is not reduced.

Figure 3:
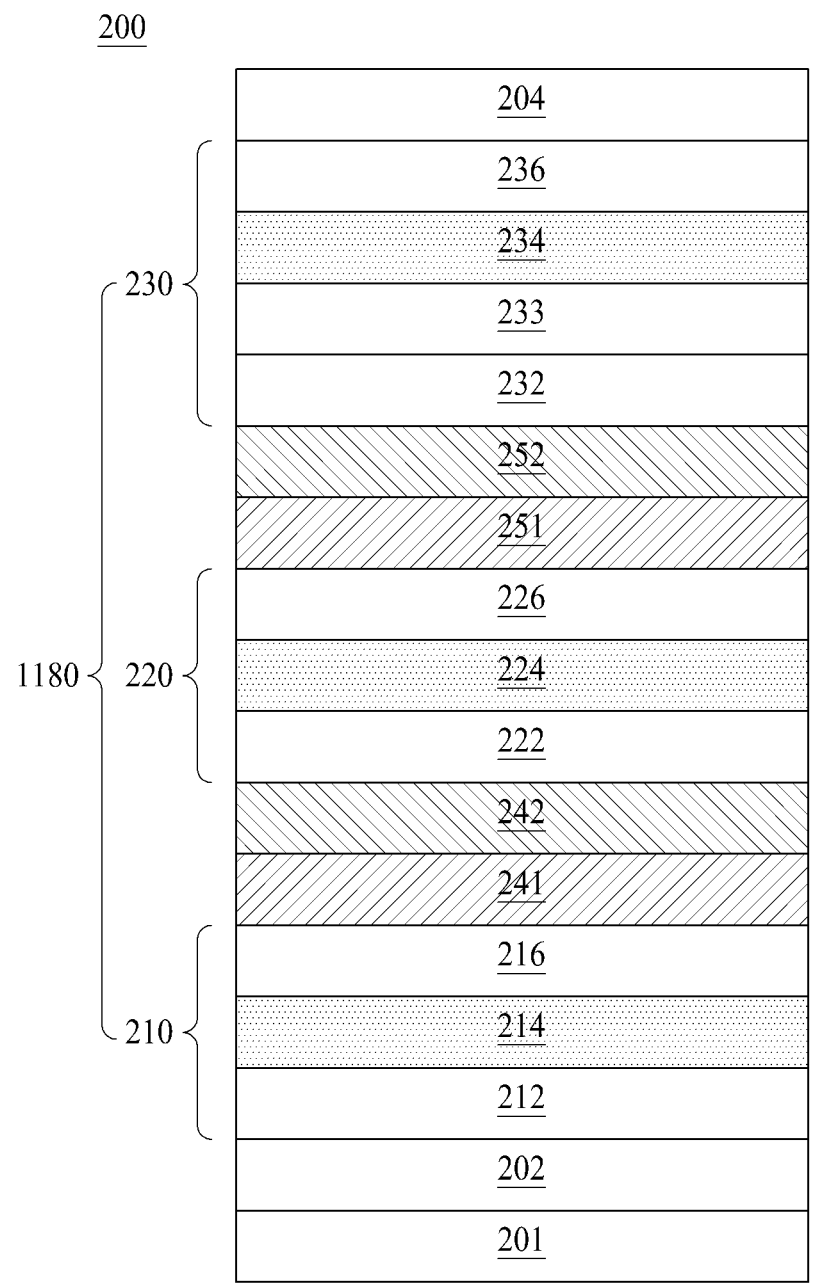
FIG. 3 is a diagram illustrating an organic light emitting device according to a second embodiment of the present disclosure.

FIG. 3 is a diagram illustrating an organic light emitting device 200 according to a second embodiment of the present disclosure.

The organic light emitting device 200 illustrated in FIG. 3 may include a substrate 201, a first electrode 202, a second electrode 204, and an emission part 1180 between the first electrode 202 and the second electrode 204. The emission part 1180 may include a first emission part 210, a second emission part 220, and a third emission part 230. The substrate 201, the first electrode 202, the second electrode 204, and the first emission part 210 illustrated in FIG. 3 may be substantially the same as the substrate 101, the first electrode 102, the second electrode 104, and the first emission part 110 described above with reference to FIG. 1, and thus, their detailed descriptions are not provided herein or will be brief.

The first emission part 210 may include a first HTL 212, a first EML 214, and a first ETL 216 which are disposed on the first electrode 202.

The first HTL 212 may be configured with a single layer or two layers. An HIL may be further formed on the first electrode 202. An HBL may be further formed on the first EML 214, and an EBL may be further formed under the first EML 214.

A hole supplied through the first HTL 212 and an electron supplied through the first ETL 216 may be recombined in the first EML 214 to generate an exciton. A zone where the exciton is generated may be referred to as a recombination zone (or a recombination area) or an emission zone (or an emission area).

The first HTL 212, the first EML 214, the first ETL 216, the EIL, the HIL, the HBL, and the EBL which configure the first emission part 210 may each be referred to as an organic layer.

The second emission part 220 may include a second HTL 222, a second EML 224, and a second ETL 226. An EIL may be further formed on the second ETL 226, and an HIL may be further formed under the second HTL 222. An HBL may be further formed on the second EML 224, and the second ETL 226 and the HBL may be provided as one layer. An EBL may be further formed on the second EML 224, and the second ETL 222 and the EBL may be provided as one layer. The second HTL 222 may be formed of a single layer.

A hole supplied through the second HTL 222 and an electron supplied through the second ETL 226 may be recombined in the second EML 224 to generate an exciton. A zone where the exciton is generated may be referred to as a recombination zone (a recombination area) or an emission zone (or an emission area).

The second EML 224 may be an EML emitting light of a second color. That is, the second EML 224 may include a yellow-green EML or a green EML. An emission zone of the second EML 224 may be within a range of 510 nm to 590 nm.

The second EML 224 may include a yellow-green EML and a red EML, a green EML and red EML, or a combination thereof. The combination thereof may include a yellow-green EML, a red EML, and a yellow-green EML or may include a yellow-green EML, a red EML, and a green EML, but is not limited thereto. Also, when a red EML is further formed, red efficiency is further enhanced. When the red EML is further formed, the red EML may be formed on or under a yellow-green EML or a green EMl. The positions or number of EMLs may be selectively determined depending on a structure and a characteristic of a device, but the present embodiment is not limited thereto. When the red EML is further provided in the second EML 224, an emission zone of the second EML 224 may be within a range of 510 nm to 650 nm.

The second EML 224 may include at least one host and dopant. Alternatively, the second EML 224 may include a mixed host, where two or more hosts are mixed, and at least one dopant. The mixed host may include a host having hole-transporting characteristic and a host having electron-transporting characteristic.

The second HTL 222, the second EML 224, the second ETL 226, the EIL, the HIL, the HBL, and the EBL which configure the second emission part 220 may each be referred to as an organic layer.

A first CGL may be further provided between the first emission part 210 and the second emission part 220. The first CGL may adjust a charge balance between the first emission part 210 and the second emission part 220. The first CGL may include a first N-type CGL 241 and a first P-type CGL 242. The first N-type CGL 241 may have a structure where alkali metal or alkali earth metal is doped on a host. Also, the first P-type CGL 242 may have a host-dopant structure including a dopant.

The third emission part 230 may include a third HTL 232, a fourth HTL 233, a third EML 234, and a third ETL 236 which are disposed on the second emission part 220.

An EIL may be further formed on the third ETL 236. Also, the third ETL 236 may be formed of two or more layers or two or more materials.

An HBL may be further formed on the third EML 234. The third ETL 236 and the HBL may be provided as one layer.

The third ETL 236, the HBL, and the EIL may each be referred to as an electron transfer layer. That is, the electron transfer layer may be a layer for injecting or transferring an electron. Also, the third HTL 232, the EBL, and the HIL may each be referred to as a hole transfer layer. That is, the hole transfer layer may be a layer for injecting or transferring a hole.

A hole supplied through the third HTL 232 and an electron supplied through the fourth ETL 233 may be recombined in the third EML 234 to generate an exciton. A zone where the exciton is generated may be referred to as a recombination zone (or recombination area) or an emission zone (or an emission area).

The third EML 234 may be an EML emitting light having the same color as the first color. That is, the third EML 234 may include one among a blue EML, a deep blue EML, and a sky blue EML. An emission zone of the third EML 234 may be within a range of 440 nm to 480 nm.

The third EML 234 may be formed of a blue EML which includes an auxiliary EML emitting light having a color different from that of light emitted from the blue EML. The auxiliary EML may be configured with one among a yellow-green EML and a red EML, or may be configured by a combination thereof. When the auxiliary EML is further provided, green or red efficiency can be further enhanced. When the third EML 234 is provided along with the auxiliary EML, the yellow-green EML, the red EML, or a green EML may be disposed on or under the third EML 234. Also, the yellow-green EML, the red EML, or the green EML may be identically or differently provided as the auxiliary EML on and under the third EML 234. The positions or number of EMLs may be selectively determined depending on a structure and a characteristic of a device, but the present embodiment is not limited thereto.

When the third EML 234 includes the auxiliary EML, an emission zone of the third EML 234 may be within a range of 440 nm to 650 nm.

The third HTL 232, the fourth HTL 233, the third EML 234, the third ETL 236, the EIL, the HIL, the HBL, and the EBL which configure the third emission part 230 may each be referred to as an organic layer.

The third EML 234 may include at least one host and dopant. Alternatively, the third EML 234 may include a mixed host, where two or more hosts are mixed, and at least one dopant. The mixed host may include a host having hole-transporting characteristic and a host having electron-transporting characteristic.

A second CGL may be further provided between the second emission part 220 and the third emission part 230. The second CGL may adjust a charge balance between the second emission part 220 and the third emission part 230. The second CGL may include a second N-type CGL 251 and a second P-type CGL 252. The second N-type CGL 251 may have a structure where alkali metal or alkali earth metal is doped on a host.

Moreover, the second P-type CGL 252 may have a structure including no dopant. Therefore, characteristic of the HTL included in the third emission part 230 should be improved for enhancing efficiency of the third EML 234. The HTL may be configured with two layers, for example, the third HTL 232 and the fourth HTL 233. In detail, the third HTL 232 may be formed of a material which is high in hole mobility, and the fourth HTL 233 may be formed of a material having electron-blocking characteristic.

Therefore, a hole mobility of the third HTL 232 may be adjusted to be higher than that of the fourth HTL 233, thereby adjusting a hole moving speed in order for a hole of the second P-type CGL 252 to be transferred to the third EML 234. Also, the third HTL 232 which is high in hole mobility may be disposed closer to the second P-type CGL 252 than the fourth HTL 233, and thus, the hole of the second P-type CGL 252 is easily transferred to the third EML 234. Since third HTL 232 which is high in hole mobility is disposed closer to the second P-type CGL 252, the hole is easily transferred to the third EML 234 despite an increase in thickness of the organic light emitting device where an HTL is configured with two layers, and thus, the driving voltage does not increase. That is, the hole mobility of the third HTL 232 and the hole mobility of the fourth HTL 233 may be based on a material which is about ten or more times general hole mobility. Therefore, the hole mobility of the third HTL 232 and the hole mobility of the fourth HTL 233 may each be within a range of $1 \times 10^{-2}$ cm$^2$/Vs to $1 \times 10^{-4}$ cm$^2$/Vs. In detail, the hole mobility of the third HTL 232 may be within a range of $1 \times 10^{-2}$ cm$^2$/Vs to $1 \times 10^{-3}$ cm$^2$/Vs, and the hole mobility of the fourth HTL 233 may be within a range of $1 \times 10^{-3}$ cm$^2$/Vs to $1 \times 10^{-4}$ cm$^2$/Vs. Therefore, the hole mobility of the third HTL 232 may be adjusted to be $1 \times 10^{1}$ cm$^2$/Vs to $1 \times 10^{2}$ cm$^2$/Vs higher than the hole mobility of the fourth HTL 233.

Moreover, the fourth HTL 233 may be configured to have electron-blocking characteristic. That is, an absolute value of a triplet energy level (T1) of the fourth HTL 233 may be adjusted to be within a range of 2.5 eV to 3.0 eV to prevent an electron of the third EML 234 from moving to the third HTL 232, and thus, a combination of an electron and a hole in the third EML 234 is enhanced, thereby enhancing the emission efficiency of the third EML 234. Also, when the absolute value of the triplet energy level (T1) of the fourth HTL 233 is less than 2.5 eV, lifetime of the organic light emitting device is reduced.

Moreover, the fourth HTL 233 having electron-blocking characteristics may be disposed closer to the third EML 234 than the third HTL 232, and thus, a triplet exciton may be confined in the third EML 234 to enhance the emission efficiency of the third EML 234, thereby enhancing efficiency of the organic light emitting device. Therefore, since the fourth HTL 233 having electron-blocking characteristic is provided as a separate layer without being combined with the third HTL 232, an electron is prevented from being transferred from the third EML 234, and thus, the triplet exciton may be confined in the third EML 234, thereby further enhancing emission efficiency.

Moreover, an absolute value of a HOMO energy level of the third HTL 232 and an absolute value of a HOMO energy level of the fourth HTL 233 may be adjusted to be equal, and thus, a hole of the second P-type CGL 252 easily moves to the third EML 234 and the fourth HTL 233. Therefore, the absolute value of the HOMO energy level of each of the third HTL 232 and the fourth HTL 233 may be adjusted to be greater than an absolute value of a LUMO energy level of the second P-type CGL 252. That is, the absolute value of the HOMO energy level of each of the third HTL 232 and the fourth HTL 233 may be within a range of 5.4 eV to 5.6 eV, and the absolute value of the LUMO energy level of the second P-type CGL 252 may be within a range of 5.3 eV to 5.5 eV. Also, a difference between the absolute value of the HOMO energy level of the third HTL 232 and the absolute value of the LUMO energy level of the second P-type CGL 252 may be within a range of 0.1 eV to 0.3 eV, and a difference between the absolute value of the HOMO energy level of the fourth HTL 233 and the absolute value of the LUMO energy level of the second P-type CGL 252 may be within a range of 0.1 eV to 0.3 eV. When the difference between the absolute value of the HOMO energy level of the third HTL 232 and the absolute value of the LUMO energy level of the second P-type CGL 252 is more than 0.3 eV and the difference between the absolute value of the HOMO energy level of the fourth HTL 233 and the absolute value of the LUMO energy level of the second P-type CGL 252 is more than 0.3 eV, it is difficult for the hole of the second P-type CGL 252 to move to the third HTL 232 and the fourth HTL 233, and thus, the driving voltage increases, and emission efficiency is reduced. Therefore, the absolute value of the HOMO energy level of the third HTL 232 and the absolute value of the LUMO energy level of the second P-type CGL 252 may have a similar energy level within a range of 0.1 eV to 0.3 eV, and the absolute value of the HOMO energy level of the fourth HTL 233 and the absolute value of the LUMO energy level of the second P-type CGL 252 may have a similar energy level within a range of 0.1 eV to 0.3 eV. Accordingly, the hole of the second P-type CGL 252 may move to the third EML 234 and the fourth HTL 233, and a hole of the third EML 234 and a hole of the fourth HTL 233 may move to the third EML 234.

Moreover, a sum of a thickness of the third HTL 232 and a thickness of the fourth HTL 233 may be within a range of 80 nm to 120 nm. In order for the hole of the second P-type CGL 252 to easily move to the third EML 234 and so as to enhance efficiency of the third EML 234, the thickness of the third HTL 232 may be adjusted to be thicker than that of the fourth HTL 233. Alternatively, since a hole mobility of the fourth HTL 233 is lower than that of the third HTL 232, the thickness of the fourth HTL 233 may be adjusted to be thinner than that of the third HTL 232 in order for a hole to better move to the third EML 234. That is, a ratio of the thickness of the third HTL 232 to the thickness of the fourth HTL 233 may be within a range of 7:3 to 8:2. For example, when the sum of the thickness of the third HTL 232 and the thickness of the fourth HTL 233 is 100 nm, the thickness of the third HTL 232 may be within a range of 70 nm to 80 nm, and the thickness of the fourth HTL 233 may be within a range of 20 nm to 30 nm.

The second P-type CGL 252 may be formed of a material having hole-transporting characteristic, for example, one among N,N'-bis(naphthalene-1-yl)-N,N'-bis(phenyl)-2,2'-dimethylbenzidine (NPD), N,N'-bis(naphthalene-1-yl)-N,N'-bis(phenyl)-benzidine (NPB), N,N'-bis-(3-methylphenyl)-N,N'-bis(phenyl)-benzidine (TPD), and 4,4',4-Tris(N-3-methylphenyl-N-phenyl-amino)-triphenylamine (MTDATA), but is not limited thereto.

Moreover, the third HTL 232 and the fourth HTL 233 may each be formed of, for example, a starburst amine group, an aromatic amine group, and/or the like, but is not limited thereto.

The inventors have measured a driving voltage, efficiency, and external quantum efficiency when the second P-type CGL 252 having a host-dopant structure includes two HTLs according to a second embodiment of the present disclosure. A result of the measurement will be described below with reference to Table 4.

TABLE 4

| Division | Driving Voltage (V) | Efficiency (cd/A) | EQE |
|---|---|---|---|
| Comparative Example 2 | 100.0% | 100.0% | 100.0% |
| Experiment Example 2 | 100.0% | 100.7% | 101.0% |

Table 4 shows a result obtained by comparing an experiment example 2, with a comparative example 2 where the driving voltage (V), the efficiency (cd/A), and the external quantum efficiency (EQE) are each set to 100.0%. Also, the driving voltage (V), the efficiency (cd/A), and the external quantum efficiency (EQE) have been measured with respect to a current density of 10 mA/cm². The experiment example 2 and the comparative example 2 shown in Table 4 have been measured by using an organic light emitting display device including the organic light emitting device of FIG. 3.

In Table 4, in the comparative example 2, the second P-type CGL 252 including a host and a P-type dopant and the second HTL 232 are provided. In the experiment example 2, the second P-type CGL 252 including a host and a P-type dopant, the third HTL 232 including two layers, and the fourth HTL 233 including two layers are provided.

To describe the driving voltage (V), it can be seen that in the driving voltage (V), the comparative example 2 is equal to the experiment example 2.

Moreover, it can be seen that in the efficiency (cd/A), the experiment example 2 is increased by about 0.7% in comparison with the comparative example 2. The external quantum efficiency (EQE) denotes emission efficiency of when light is output to outside the organic light emitting device, and it can be seen that in the emission efficiency, the experiment example 2 increases by about 1.0% in comparison with the comparative example 2.

Accordingly, when a P-type CGL including a host and a dopant and an HTL including two layers are provided, it can be seen that the driving voltage does not increase, and the efficiency or the external quantum efficiency is enhanced.

A result obtained by measuring a driving voltage, efficiency, and external quantum efficiency according to the second embodiment of the present disclosure will be described below with reference to the following Table 5.

TABLE 5

| Division | Driving Voltage (V) | Efficiency (cd/A) | EQE |
|---|---|---|---|
| Comparative Example 2 | 100.0% | 100.0% | 100.0% |
| Second Embodiment | 91.7% | 101.0% | 100.0% |

Table 5 shows a result obtained by comparing the second embodiment of the present disclosure, with the comparative example 2 where the driving voltage (V), the efficiency (cd/A), and the external quantum efficiency (EQE) are each set to 100.0%. Also, the driving voltage (V), the efficiency (cd/A), and the external quantum efficiency (EQE) have been measured with respect to a current density of 10 mA/cm². The second embodiment of the present disclosure and the comparative example 2 shown in Table 5 have been measured by using an organic light emitting display device including the organic light emitting device of FIG. 3.

In Table 5, in the comparative example 2, the second P-type CGL 252 including a host and a P-type dopant and the second HTL 232 which is a single layer are provided. In the second embodiment of the present disclosure, the second P-type CGL 252 including no dopant, the third HTL 232 including two layers, and the fourth HTL 233 including two layers are provided.

To describe the driving voltage (V), it can be seen that in the driving voltage (V), the second embodiment of the present disclosure is reduced by about 8.3% in comparison with the comparative example 2. Therefore, it can be seen that when the second P-type CGL 252 including no dopant is provided, the driving voltage does not increase despite that a hole does not move to the third HTL 232 and the fourth HTL 233. Also, it can be seen that even when a thickness of the organic light emitting device increases because the organic light emitting device is configured with the third HTL 232 and the fourth HTL 233, the driving voltage does not increase. Also, a difference between an absolute value of a LUMO energy level of the second P-type CGL 252 and an absolute value of a HOMO energy level of each of the third HTL 232 and the fourth HTL 233 is adjusted to be a small value, and thus, it can be seen that a hole moves from the second P-type CGL 252 to the third HTL 232 and the fourth HTL 233. Also, when the third HTL 232 is formed of a material which is high in hole mobility and the fourth HTL 233 is formed of a material having electron-blocking characteristic, the hole of the second P-type CGL 252 moves to the third EML 234, and thus, it can be seen that a balance of electrons and holes in the third EML 234 is made, and thus, the driving voltage does not increase.

Moreover, it can be seen that in the efficiency (cd/A), the second embodiment of the present disclosure increases by about 1.0% in comparison with the comparative example 2. The external quantum efficiency (EQE) denotes emission efficiency of when light is output to outside the organic light emitting device, and it can be seen that in the emission efficiency, the second embodiment of the present disclosure is equal to the comparative example 2.

Therefore, the second embodiment of the present disclosure provides an organic light emitting display device in which the driving voltage is reduced, and the efficiency or the external quantum efficiency is enhanced in comparison with a case where a P-type CGL including no dopant and an HTL which is a single layer are provided. That is, in the second embodiment of the present disclosure, a P-type CGL including no dopant and a plurality of HTLs each including two layers are provided, and the two layers are configured so that a difference between an absolute value of a LUMO energy level of the P-type CGL and an absolute value of a HOMO energy level of an HTL adjacent to the P-type CGL is adjusted to be a small value. Also, one among the two layers included in each of the HTLs is formed of a material which is high in hole mobility, and the other of the two layers is formed of a material having electron-blocking characteristic, whereby it can be seen that an organic light emitting display device, in which the driving voltage is reduced and the efficiency or the external quantum efficiency is not reduced, is provided.

A result, data obtained by measuring a driving voltage, efficiency, and external quantum efficiency according to an experiment example 2 and a second embodiment of the present disclosure, will be described below with reference to the following Table 6.

TABLE 6

| Division | Driving Voltage (V) | Efficiency (cd/A) | EQE |
|---|---|---|---|
| Experiment Example 2 | 100.0% | 100.0% | 100.0% |
| Second Embodiment | 100.0% | 100.5% | 101.5% |

Table 6 shows a result obtained by comparing the second embodiment, with the experiment example 2 where the driving voltage (V), the efficiency (cd/A), and the external quantum efficiency (EQE) are each set to 100.0%. Also, the driving voltage (V), the efficiency (cd/A), and the external quantum efficiency (EQE) have been measured with respect to a current density of 10 mA/cm$^2$. The second embodiment and the experiment example 2 shown in Table 6 have been measured by using an organic light emitting display device including the organic light emitting device of FIG. 2.

In Table 6, in the experiment example 2, the second P-type CGL 252 including a host and a P-type dopant, the third HTL 232 including two layers, and the fourth HTL 233 including two layers are provided. In the second embodiment, the second P-type CGL 252 including no dopant, the third HTL 232 including two layers, and the fourth HTL 233 including two layers are provided.

To describe the driving voltage (V), it can be seen that in the driving voltage (V), the second embodiment is equal to the experiment example 2.

Moreover, it can be seen that in the efficiency (cd/A), the second embodiment increases by about 0.5% in comparison with the experiment example 2. The external quantum efficiency (EQE) denotes emission efficiency of when light is output to outside the organic light emitting device, and it can be seen that in the emission efficiency, the second embodiment increases by about 1.5% in comparison with the experiment example 2.

Therefore, it can be seen that the second embodiment of the present disclosure, corresponding to a case where a P-type CGL including no dopant and an HTL including two layers are provided, provides an organic light emitting display device in which the driving voltage does not increase and the efficiency or the external quantum efficiency is enhanced in comparison with a case where a P-type CGL including a host and a dopant and an HTL including two layers are provided.

Figure 4:
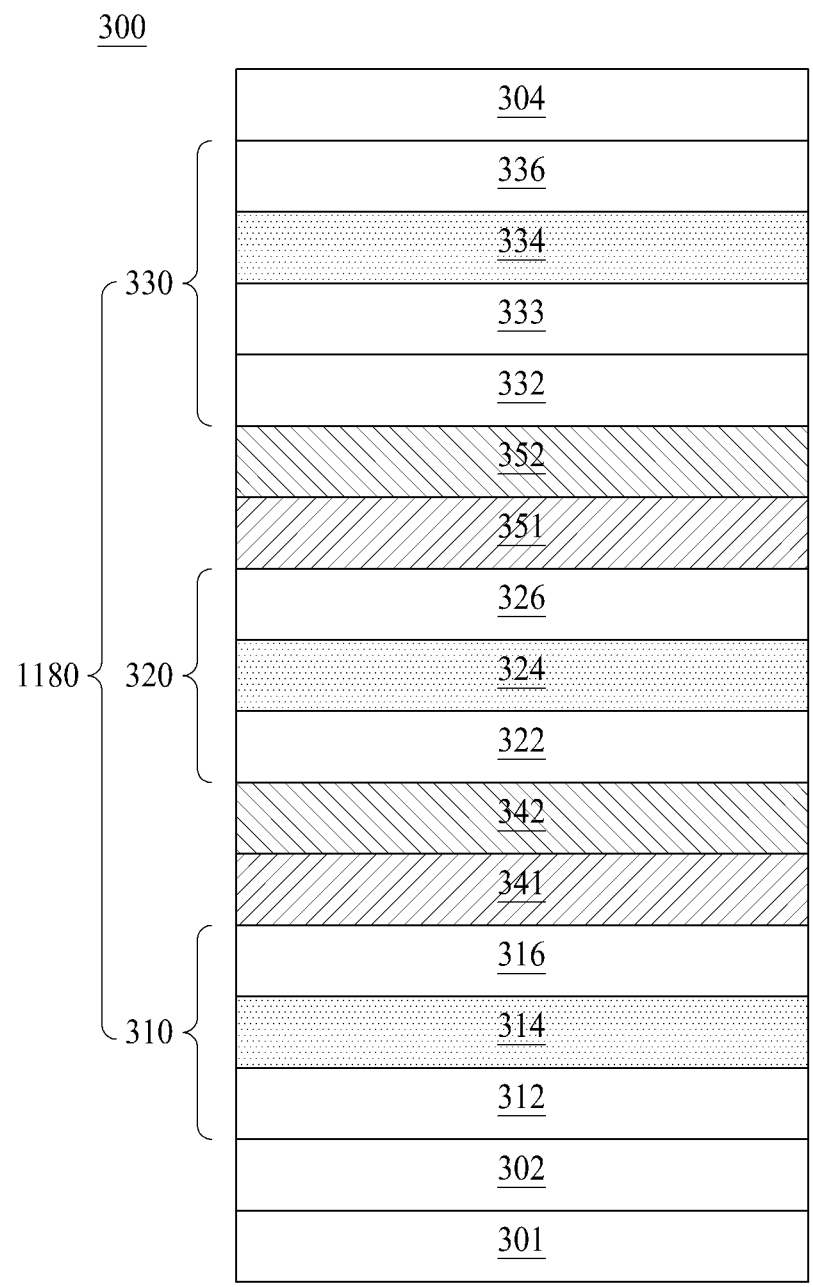
FIG. 4 is a diagram illustrating an organic light emitting device according to a third embodiment of the present disclosure.

FIG. 4 is a diagram illustrating an organic light emitting device 300 according to a third embodiment of the present disclosure.

The organic light emitting device 300 illustrated in FIG. 4 may include a substrate 301, a first electrode 302, a second electrode 304, and an emission part 1180 between the first electrode 302 and the second electrode 304. The emission part 1180 may include a first emission part 310, a second emission part 320, and a third emission part 330. The substrate 301, the first electrode 302, the second electrode 304, and the first emission part 310 illustrated in FIG. 4 may be substantially the same as the substrate 101, the first electrode 102, the second electrode 104, and the first emission part 110 described above with reference to FIG. 1, and thus, their detailed descriptions are not provided herein or will be brief.

The first emission part 310 may include a first HTL 312, a first EML 314, and a first ETL 316 which are disposed on the first electrode 302.

An HIL may be further formed on the first electrode 302. An HBL may be further formed on the first EML 314, and an EBL may be further formed under the first EMI, 314. The first HTL 312 may be configured with a single layer or two layers.

A hole supplied through the first HTL 312 and an electron supplied through the first ETL 316 may be recombined in the first EML 314 to generate an exciton. A zone where the exciton is generated may be referred to as a recombination zone (or a recombination area) or an emission zone (or an emission area).

The first HTL 312, the first EML 314, the first ETL 316, the EIL, the HIL, the HBL, and the EBL which configure the first emission part 310 may each be referred to as an organic layer.

The second emission part 320 may include a second HTL 322, a second EML 324, and a second ETL 326.

An EIL may be further formed on the second ETL 326. An HBL may be further formed on the second EML 324, and the second ETL 326 and the HBL may be provided as one layer. The second HTL 322 may be formed of a single layer.

A hole supplied through the second HTL 322 and an electron supplied through the second ETL 326 may be recombined in the second EML 324 to generate an exciton. A zone where the exciton is generated may be referred to as a recombination zone (or a recombination area) or an emission zone (or an emission area).

The second EML 324 may be an EML emitting light of a second color. That is, the second EML 324 may include a yellow-green EML or a green EML. An emission zone of the second EML 324 may be within a range of 510 nm to 590 nm.

The second EML 324 may include a yellow-green EML and a red EML, a green EML and red EML, or a combination thereof. The combination thereof may include a yellow-green EML, a red EML, and a yellow-green EML or may include a yellow-green EML, a red EML, and a green EML, but is not limited thereto. Also, when a red EML is further formed, red efficiency is further enhanced. When the red EML is further formed, the red EML may be formed on or under a yellow-green EML or a green EML. The positions or number of EMLs may be selectively determined depending on a structure and a characteristic of a device, but the present embodiment is not limited thereto. When the red EML is further provided in the second EML 324, an emission zone of the second EML 324 may be within a range of 510 nm to 650 nm.

The second EML 324 may include at least one host and dopant. Alternatively, the second EML 324 may include a mixed host, where two or more hosts are mixed, and at least one dopant. The mixed host may include a host having hole-transporting characteristic and a host having electron-transporting characteristic.

The second HTL 322, the second EML 324, the second ETL 326, the EIL, the HIL, the HBL, and the EBL which configure the second emission part 320 may each be referred to as an organic layer.

A first CGL may be further provided between the first emission part 310 and the second emission part 320. The first CGL may adjust a charge balance between the first emission part 310 and the second emission part 320. The first CGL may include a first N-type CGL 341 and a first P-type CGL 342. The first N-type CGL 341 may have a structure where alkali metal or alkali earth metal is doped on a host. Also, the first P-type CGL 342 may have a host-dopant structure including a dopant.

The first P-type CGL 342 may have a structure including no dopant. Therefore, since the first P-type CGL 342 does not include a dopant, the inventors have recognized that an HTL having an absolute value of a highest occupied molecular orbitals (HOMO) energy level which is small in difference with an absolute value of a LUMO energy level of the first P-type CGL 342 is provided for enhancing efficiency. When an HTL having an absolute value of a HOMO energy level which is large in difference with the absolute value of the LUMO energy level of the first P-type CGL 342 is provided, it is difficult for a hole of the first P-type CGL 342 to move to the second EML 324, and thus, a voltage of the organic light emitting device increases, or an efficiency of the organic light emitting device is reduced. Also, the inventors have recognized that a hole mobility of the second HTL 322 should be improved in order for a hole to easily move from the first P-type CGL 342 to the second HTL 322.

Therefore, in order to lower the driving voltage and enhance efficiency, the second HTL 322 is formed of first and second materials having two kinds of characteristics, and the first and second materials are mixed through co-deposition. Therefore, when the second HTL 322 is configured with two layers, the driving voltage is prevented from increasing because a thickness of the second HTL 322 is thickened, and emission efficiency is prevented from being reduced because an emission position of the second EML 324 is changed. A thickness of the second HTL 322 may be within a range of 5 nm to 10 nm. When a thickness of the second HTL 322 is adjusted to be less than 5 nm, the second HTL 322 cannot function, and for this reason, it is difficult for a hole of the first P-type CGL 342 to move to the second EML 324, thereby increasing the driving voltage and reducing efficiency. Also, when a thickness of the second HTL 322 is adjusted to be more than 5 nm, a thickness of the organic light emitting device is thickened, causing an increase in the driving voltage. Also, the first material and the second material included in the second HTL 322 may be configured at an equal ratio. That is, in the second HTL 322, a ratio of the first material to the second material may be 5:5 in volume ratio. Here, the volume ratio denotes a volume of a portion occupied by a certain material in a certain layer, and the volume ratio may be based on a sum of occupied volumes.

Therefore, in the first material of the second HTL 322, an absolute value of a HOMO energy level of the second HTL 322 may be adjusted to be greater than an absolute value of a LUMO energy level of the first P-type CGL 342 so that a barrier is not formed when a hole of the first P-type CGL 342 moves to the second HTL 322. That is, the absolute value of the HOMO energy level of the second HTL 322 may be within a range of 5.4 eV to 5.6 eV, and the absolute value of the LUMO energy level of the first P-type CGL 342 may be within a range of 5.3 eV to 5.5 eV. Also, a difference between the absolute value of the HOMO energy level of the second HTL 322 and the absolute value of the LUMO energy level of the first P-type CGL 342 may be within a range of 0.1 eV to 0.3 eV. In a case where the difference between the absolute value of the HOMO energy level of the second HTL 322 and the absolute value of the LUMO energy level of the first P-type CGL 342 is more than 0.3 eV, since it is difficult for a hole of the first P-type CGL 342 to move to the second HTL 322, the driving voltage increases, and the emission efficiency of the second EML 324 is reduced. Therefore, the absolute value of the HOMO energy level of the second HTL 322 and the absolute value of the LUMO energy level of the first P-type CGL 342 may have a similar energy level within a range of 0.1 eV to 0.3 eV. Accordingly, a hole of the first P-type CGL 342 may move to the second HTL 322, and a hole of the second HTL 322 may move to the second EML 324.

Moreover, the second material of the second HTL 322 may be formed of a material which is high in hole mobility, and thus enables a hole to easily move to the second EML 324. A hole mobility of the second material may be about 10 times higher than that of a general HTL. For example, the hole mobility of the second material may be within a range of $1 \times 10^{-2}$ $cm^2/Vs$ to $1 \times 10^{-4}$ $cm^2/Vs$.

The first P-type CGL 342 may be formed of a material having hole-transporting characteristic, for example, one among N,N'-bis(naphthalene-1-yl)-N,N'-bis(phenyl)-2,2'-dimethylbenzidine (NPD), N,N'-bis(naphthalene-1-yl)-N,N'-bis(phenyl)-benzidine (NPB), N,N'-bis-(3-methylphenyl)-N,N'-bis(phenyl)-benzidine (TPD), and 4,4',4-Tris(N-3-methylphenyl-N-phenyl-amino)-triphenylamine (MTDATA), but is not limited thereto.

Moreover, the first and second materials of the second HTL 322 may include, for example, a starburst amine group, an aromatic amine group, and/or the like, but is not limited thereto.

The third emission part 330 may include a third HTL 332, a fourth HTL 333, a third EML 334, and a third ETL 336 which are disposed on the second emission part 320.

An EIL may be further formed on the third ETL 336. Also, the third ETL 336 may be formed of two or more layers or two or more materials.

An HBL may be further formed on the third EMI 334. The third ETL 336 and the HBL may be provided as one layer.

The third ETL 336, the HBL, and the EIL may each be referred to as an electron transfer layer. That is, the electron transfer layer may be a layer for injecting or transferring an electron. Also, the third HTL 332, the EBL, and the HIL may each be referred to as a hole transfer layer. That is, the hole transfer layer may be a layer for injecting or transferring a hole.

A hole supplied through the third HTL 332 and an electron supplied through the fourth ETL 333 may be recombined in the third EML 334 to generate an exciton. A zone where the exciton is generated may be referred to as a recombination zone or an emission zone (or an emission area).

The third EML 334 may be an EML emitting light having the same color as the first color. That is, the third EML 334 may include one among a blue EML, a deep blue EML, and a sky blue EML. An emission zone of the third EML 334 may be within a range of 440 nm to 480 mi.

The third EML 334 may be formed of a blue EML which includes an auxiliary EML emitting light having a color different from that of light emitted from the blue EML. The auxiliary EML may be configured with one among a yellow-green EML and a red EML, or may be configured by a combination thereof. When the auxiliary EML is further provided, green or red efficiency can be further enhanced. When the third EML 334 is provided along with the auxiliary EML, the yellow-green EML, the red EML, or a green EML may be disposed on or under the third EML 334. Also, the yellow-green EML, the red EML, or the green EML may be identically or differently provided as the auxiliary EML on and under the third EML 334. The positions or number of EMLs may be selectively determined depending on a structure and a characteristic of a device, but the present embodiment is not limited thereto. When the third EML 334 includes the auxiliary EML, an emission zone of the third EML 334 may be within a range of 440 nm to 650 nm.

The third EML 334 may include at least one host and dopant. Alternatively, the third EML 334 may include a mixed host, where two or more hosts are mixed, and at least one dopant. The mixed host may include a host having hole-transporting characteristic and a host having electron-transporting characteristic.

The third HTL 332, the fourth HTL 333, the third EML 334, the third ETL 336, the EIL, the HIL, the HBL, and the EBL which configure the third emission part 330 may each be referred to as an organic layer.

A second CGL may be further provided between the second emission part 320 and the third emission part 330. The second CGL may adjust a charge balance between the second emission part 320 and the third emission part 330. The second CGL may include a second N-type CGL 351 and a second P-type CGL 352. The second N-type CGL 351 may have a structure where alkali metal or alkali earth metal is doped on a host.

Moreover, the second P-type CGL 352 may have a structure including no dopant. Therefore, characteristic of the HTL included in the third emission part 330 should be improved for enhancing efficiency of the third EML 334. The HTL may be configured with two layers, for example, the third HTL 332 and the fourth HTL 333. In detail, the third HTL 332 may be formed of a material which is high in hole mobility, and the fourth HTL 333 may be formed of a material having electron-blocking characteristic.

Therefore, a hole mobility of the third HTL 332 may be adjusted to be higher than that of the fourth HTL 333, thereby adjusting a hole moving speed in order for a hole of the second P-type CGL 352 to be transferred to the third EML 334. Also, the third HTL 332 which is high in hole mobility may be disposed closer to the second P-type CGL 352 than the fourth HTL 333, and thus, the hole of the second P-type CGL 352 is easily transferred to the third EML 334. Since third HTL 332 which is high in hole mobility is disposed closer to the second P-type CGL 352, the hole is easily transferred to the third EML 334 despite an increase in thickness of the organic light emitting device where an HTL is configured with two layers, and thus, the driving voltage does not increase. That is, the hole mobility of the third HTL 332 and the hole mobility of the HTL 333 may be based on a material which is about ten or more times general hole mobility. Therefore, the hole mobility of the third HTL 332 and the hole mobility of the fourth HTL 333 may each be within a range of $1\times10^{-2}$ $cm^2/Vs$ to $1\times10^{-4}$ $cm^2/Vs$. In detail, the hole mobility of the third HTL 332 may be within a range of $1\times10^{-2}$ $cm^2/Vs$ to $1\times10^{-3}$ $cm^2/Vs$, and the hole mobility of the fourth HTL 333 may be within a range of $1\times10^{-3}$ $cm^2/Vs$ to $1\times10^{-4}$ $cm^2/Vs$. Therefore, the hole mobility of the third HTL 332 may be adjusted to be $1\times10^{1}$ $cm^2/Vs$ to $1\times10^{2}$ $cm^2/Vs$ higher than the hole mobility of the fourth HTL 333.

Moreover, the fourth HTL 333 may be configured to have electron-blocking characteristic. That is, an absolute value of a triplet energy level (T1) of the fourth HTL 333 may be adjusted to be within a range of 2.5 eV to 3.0 eV to prevent an electron of the third EML 334 from moving to the third HTL 332, and thus, a combination of an electron and a hole in the third EML 334 is enhanced, thereby enhancing the emission efficiency of the third EML 334. Also, when the absolute value of the triplet energy level (T1) of the fourth HTL 333 is less than 2.5 eV, lifetime of the organic light emitting device is reduced.

Moreover, the fourth HTL 333 having electron-blocking characteristic may be disposed closer to the third EML 334 than the third HTL 332, and thus, a triplet exciton may be confined in the third EML 334 to enhance the emission efficiency of the third EML 334, thereby enhancing efficiency of the organic light emitting device. Therefore, since the fourth HTL 333 having electron-blocking characteristic is provided as a separate layer without being combined with the third HTL 332, an electron is prevented from being transferred from the third EML 334, and thus, the triplet exciton may be confined in the third EML 334, thereby further enhancing emission efficiency.

Moreover, an absolute value of a HOMO energy level of the third HTL 332 and an absolute value of a HOMO energy level of the fourth HTL 333 may be adjusted to be equal, and thus, a hole of the second P-type CGL 352 easily moves to the third EML 334 and the fourth HTL 333. Therefore, the absolute value of the HOMO energy level of each of the third HTL 332 and the fourth HTL 333 may be adjusted to be greater than an absolute value of a LUMO energy level of the second P-type CGL 352. That is, the absolute value of the HOMO energy level of each of the third HTL 332 and the fourth HTL 333 may be within a range of 5.4 eV to 5.6 eV, and the absolute value of the LUMO energy level of the second P-type CGL 352 may be within a range of 5.3 eV to 5.5 eV. Also, a difference between the absolute value of the HOMO energy level of the third HTL 332 and the absolute value of the LUMO energy level of the second P-type CGL 352 may be within a range of 0.1 eV to 0.3 eV, and a difference between the absolute value of the HOMO energy level of the fourth HTL 333 and the absolute value of the LUMO energy level of the second P-type CGL 352 may be within a range of 0.1 eV to 0.3 eV. When the difference between the absolute value of the HOMO energy level of the third HTL 332 and the absolute value of the LUMO energy level of the second P-type CGL 352 is more than 0.3 eV and the difference between the absolute value of the HOMO energy level of the fourth HTL 333 and the absolute value of the LUMO energy level of the second P-type CGL 352 is more than 0.3 eV, it is difficult for the hole of the second P-type CGL 352 to move to the third HTL 332 and the fourth HTL 333, and thus, the driving voltage increases, and emission efficiency is reduced. Therefore, the absolute value of the HOMO energy level of the third HTL 332 and the absolute value of the LUMO energy level of the second P-type CGL 352 may have a similar energy level within a range of 0.1 eV to 0.3 eV, and the absolute value of the HOMO energy level of the fourth HTL 333 and the absolute value of the LUMO energy level of the second P-type CGL 352 may have a similar energy level within a range of 0.1 eV to 0.3 eV. Accordingly, the hole of the second P-type CGL 352 may move to the third EML 334 and the fourth HTL 333, and a hole of the third EML 334 and a hole of the fourth HTL 333 may move to the third EML 334.

Moreover, a sum of a thickness of the third HTL 332 and a thickness of the fourth HTL 333 may be within a range of 80 nm to 120 nm. In order for the hole of the second P-type CGL 352 to easily move to the third EML 334 and so as to enhance efficiency of the third EML 334, the thickness of the third HTL 332 may be adjusted to be thicker than that of the fourth HTL 333. Alternatively, since a hole mobility of the fourth HTL 333 is lower than that of the third HTL 332, the thickness of the fourth HTL 333 may be adjusted to be thinner than that of the third HTL 332 in order for a hole to better move to the third EML 334. That is, a ratio of the thickness of the third HTL 332 to the thickness of the fourth HTL 333 may be within a range of 7:3 to 8:2. For example, when the sum of the thickness of the third HTL 332 and the thickness of the fourth HTL 333 is 100 nm, the thickness of the third HTL 332 may be within a range of 70 nm to 80 nm, and the thickness of the fourth HTL 333 may be within a range of 20 nm to 30 nm.

The second P-type CGL 352 may be formed of a material having hole-transporting characteristic, for example, one among N,N'-bis(naphthalene-1-yl)-N,N'-bis(phenyl)-2,2'-dimethylbenzidine (NPD), N,N'-bis(naphthalene-1-yl)-N,N'-bis(phenyl)-benzidine (NPB), N,N'-bis-(3-methylphenyl)-N,N'-bis(phenyl)-benzidine (TPD), and 4,4',4-Tris(N-3-methylphenyl-N-phenyl-amino)-triphenylamine (MTDATA), but is not limited thereto.

Moreover, the third HTL 332 and the fourth HTL 333 may each be formed of, for example, a starburst amine group, an aromatic amine group, and/or the like, but is not limited thereto.

A result obtained by measuring a driving voltage, efficiency, and external quantum efficiency according to a third embodiment of the present disclosure will be described below with reference to the following Table 7.

TABLE 7

| Division | Driving Voltage (V) | Efficiency (cd/A) | EQE |
|---|---|---|---|
| Experiment Example 3 | 100.0% | 100.0% | 100.0% |
| Third Embodiment | 91.7% | 107.7% | 107.0% |

Table 7 shows a result obtained by comparing the third embodiment of the present disclosure, with the comparative example 3 where the driving voltage (V), the efficiency (cd/A), and the external quantum efficiency (EQE) are each set to 100.0%. Also, the driving voltage (V), the efficiency (cd/A), and the external quantum efficiency (EQE) have been measured with respect to a current density of 10 mA/cm². The third embodiment of the present disclosure and the comparative example 3 shown in Table 7 have been measured by using an organic light emitting display device including the organic light emitting device of FIG. 4.

In Table 7, in the comparative example 3, the first P-type CGL 342 including a host and a P-type dopant, the second HTL 322, the second P-type CGL 352 including a host and a P-type dopant, and the third HTL 332 are provided. In the third embodiment of the present disclosure, the first P-type CGL 342 including no dopant, the second HTL 322 including a combination of two materials, the second P-type CGL 352 including no dopant, the third HTL 332 including two layers, and the fourth HTL 333 including two layers are provided.

To describe the driving voltage (V), it can be seen that in the driving voltage (V), the third embodiment of the present disclosure is reduced by about 8.3% in comparison with the comparative example 3. Therefore, it can be seen that when the first P-type CGL 342 including no dopant and the second P-type CGL 352 including no dopant are provided, the driving voltage does not increase despite that a hole does not move to the second HTL 322, the third HTL 332, and the fourth HTL 333. Also, it can be seen that even when a thickness of the organic light emitting device increases because the organic light emitting device is configured with the third HTL 332 and the fourth HTL 333, the driving voltage does not increase. Also, a difference between an absolute value of a LUMO energy level of the first P-type CGL 342 and an absolute value of a HOMO energy level of the second HTL 322 is adjusted to be a small value, and thus, it can be seen that a hole moves from the first P-type CGL 342 to the second P-type CGL 352. Also, a difference between an absolute value of a LUMO energy level of the second P-type CGL 352 and an absolute value of a HOMO energy level of each of the third HTL 332 and the fourth HTL 333 is adjusted to be a small value, and thus, it can be seen that a hole moves from the second P-type CGL 352 to the third HTL 332 and the fourth HTL 333. Also, it can be seen that since the fourth HTL 333 is formed of a material which is high in hole mobility, the hole of the second P-type CGL 352 moves to the third EML 334, and thus, the driving voltage does not increase.

Moreover, it can be seen that in the efficiency (cd/A), the third embodiment of the present disclosure increases by about 7.7% in comparison with the comparative example 3. The external quantum efficiency (EQE) denotes emission efficiency of when light is output to outside the organic light emitting device, and it can be seen that in the emission efficiency, the third embodiment of the present disclosure increases by about 7.0% in comparison with the comparative example 3.

Therefore, the third embodiment of the present disclosure provides an organic light emitting display device in which the driving voltage is reduced, and the efficiency or the external quantum efficiency is enhanced in comparison with the comparative example 3. That is, in the third embodiment of the present disclosure corresponding to a case where the first P-type CGL including no dopant, an HTL including a combination of two materials, an HTL including two layers, and a P-type CGL including no dopant are provided, provided is an organic light emitting display device in which the driving voltage is reduced and the efficiency or the external quantum efficiency is not reduced.

The above-described organic light emitting device according to the embodiments of the present disclosure may be applied to a lighting apparatus, may be used as a light source of a liquid crystal display (LCD) device, and may be applied to a display device. An organic light emitting display device including the organic light emitting device according to the embodiments of the present disclosure may be a white organic light emitting display device that emits white light by using a first emission part including a first EML, a second emission part including a second EML, and a third emission part including a third EML. Therefore, when the organic light emitting device according to the embodiments of the present disclosure is applied to an organic light emitting display device, the organic light emitting display device may be implemented as a white organic light emitting display device including four pixels (for example, a white pixel, a red pixel, a green pixel, and a blue pixel). Alternatively, when the organic light emitting device according to the embodiments of the present disclosure is applied to an organic light emitting display device, the organic light emitting display device may be implemented as a white organic light emitting display device including three pixels (for example, a red pixel, a green pixel, and a blue pixel). Also, an organic light emitting display device including the organic light emitting device according to the embodiments of the present disclosure may be applied to a bottom emission display device, a top emission display device, a dual emission display device, a lighting device for vehicles, and/or the like. The lighting device for vehicles may be at least one among headlights, a high beam, taillights, a brake light, a back-up light, a fog lamp, a turn signal light, and an auxiliary lamp, but is not limited thereto. Alternatively, the organic light emitting display device including the organic light emitting device according to the embodiments of the present disclosure may be applied to all indicator lamps which are used to secure a field of view of a driver and transmit or receive a signal of a vehicle. Also, the organic light emitting display device including the organic light emitting device according to the embodiments of the present disclosure may be applied to mobile equipment, monitors, televisions (TVs), and/or the like.

As described above, according to the embodiments of the present disclosure, a P-type CGL including no dopant and a hole transport layer adjacent to the P-type CGL may each be formed by mixing two materials, one among the two materials may have an absolute value of a LUMO energy level which is similar to an absolute value of a LUMO energy level of the P-type CGL, and the other of the two materials may be relatively high in hole mobility, thereby providing an organic light emitting display device in which a driving voltage is reduced, and efficiency or external quantum efficiency is not reduced.

Moreover, according to the embodiments of the present disclosure, since a P-type CGL including no dopant is provided, the manufacturing cost of an organic light emitting display device is reduced.

Moreover, according to the embodiments of the present disclosure, a P-type CGL including no dopant and a hole transport layer adjacent to the P-type CGL may each be configured with two layers, and absolute values of HOMO energy levels of the two layers may be equal, thereby providing an organic light emitting display device in which the emission efficiency of an EML is enhanced, and a driving voltage is reduced.

Moreover, according to the embodiments of the present disclosure, a P-type CGL including no dopant and a hole transport layer adjacent to the P-type CGL may each be configured with two layers (for example, a first layer and a second layer), absolute values of LUMO energy levels of the first and second layers may be similar to an absolute value of a LUMO energy level of the P-type CGL, the first layer may be formed of a material which is higher in hole mobility than the second layer, and the second layer may be formed of a material having electron-blocking characteristic, thereby providing an organic light emitting display device in which a driving voltage is reduced, and efficiency or external quantum efficiency is not reduced.

As described above, according to the embodiments of the present disclosure, a P-type CGL including no dopant and a hole transport layer adjacent to the P-type CGL may each be formed by mixing two materials, one among the two materials may have an absolute value of a LUMO energy level which is similar to an absolute value of a LUMO energy level of the P-type CGL, and the other of the two materials may be relatively high in hole mobility, thereby providing an organic light emitting display device in which a driving voltage is reduced, and efficiency or external quantum efficiency is not reduced.

Moreover, according to the embodiments of the present disclosure, since a P-type CGL including no dopant is provided, the manufacturing cost of an organic light emitting display device is reduced.

Moreover, according to the embodiments of the present disclosure, a P-type CGL including no dopant and a hole transport layer adjacent to the P-type CGL may each be configured with two layers, and absolute values of HOMO energy levels of the two layers may be equal, thereby providing an organic light emitting display device in which the emission efficiency of an EML is enhanced, and a driving voltage is reduced.

Moreover, according to the embodiments of the present disclosure, a P-type CGL including no dopant and a hole transport layer adjacent to the P-type CGL may each be configured with two layers (for example, a first layer and a second layer), absolute values of LUMO energy levels of the first and second layers may be similar to an absolute value of a LUMO energy level of the P-type CGL, the first layer may be formed of a material which is higher in hole mobility than the second layer, and the second layer may be formed of a material having electron-blocking characteristic, thereby providing an organic light emitting display device in which a driving voltage is reduced, and efficiency or external quantum efficiency is not reduced.

An organic light emitting display device according to the present disclosure comprises a first emission part including a first hole transport layer, a first emission layer, and a first electron transport layer, a second emission part on the first emission part, the second emission part including a second hole transport layer, a second emission layer, and a second electron transport layer, and a first P-type charge generation layer between the first emission part and the second emission part, wherein the second hole transport layer and the first P-type charge generation layer are disposed adjacent to each other, and the second hole transport layer includes a first material and a second material, an absolute value of a highest occupied molecular orbitals (HOMO) energy level of the first material being greater than an absolute value of a lowest unoccupied molecular orbitals (LUMO) energy level of the first P-type charge generation layer.

According to one or more embodiments of the present disclosure, a difference between the absolute value of the HOMO energy level of the first material and the absolute value of the LUMO energy level of the first P-type charge generation layer may be within a range of approximately 0.1 eV to 0.3 eV.

According to one or more embodiments of the present disclosure, a hole mobility of the second material may be within a range of approximately $1\times10^{-2}$ cm$^2$/Vs to $1\times10^{-4}$ cm$^2$/Vs.

According to one or more embodiments of the present disclosure, a volume ratio of the first material to the second material may be approximately 5:5.

According to one or more embodiments of the present disclosure, the first P-type charge generation layer may not include a dopant.

According to one or more embodiments of the present disclosure, the first material and the second material may be mixed by co-deposition.

The organic light emitting display device according to one or more embodiments of the present disclosure may further include a third emission part on the second emission part, the third emission part including a third hole transport layer, a fourth hole transport layer, a third emission layer, and a third electron transport layer, and a second P-type charge generation layer between the second emission part and the third emission part.

According to one or more embodiments of the present disclosure, the second P-type charge generation layer may not include a dopant. An absolute value of a HOMO energy level of the third hole transport layer and an absolute value of a HOMO energy level of the fourth hole transport layer may each be greater than an absolute value of a LUMO energy level of the second P-type charge generation layer.

According to one or more embodiments of the present disclosure, a difference between the absolute value of the HOMO energy level of the third hole transport layer and the absolute value of the LUMO energy level of the second P-type charge generation layer may be within a range of approximately 0.1 eV to 0.3 eV, and a difference between the absolute value of the HOMO energy level of the fourth hole transport layer and the absolute value of the LUMO energy level of the second P-type charge generation layer may be within a range of approximately 0.1 eV to 0.3 eV.

According to one or more embodiments of the present disclosure, an absolute value of a triplet energy level of the fourth hole transport layer may be within a range of approximately 2.5 eV to 3.0 eV.

According to one or more embodiments of the present disclosure, a hole mobility of the third hole transport layer may be higher than a hole mobility of the fourth hole transport layer.

According to one or more embodiments of the present disclosure, the third hole transport layer may be disposed closer to the second P-type charge generation layer than the fourth hole transport layer.

According to one or more embodiments of the present disclosure, a ratio of a thickness of the third hole transport layer to a thickness of the fourth hole transport layer may be within a range of approximately 7:3 to 8:2.

An organic light emitting display device according to the present disclosure comprises a first emission part including a first hole transport layer, a first emission layer, and a first electron transport layer, a second emission part on the first emission part, the second emission part including a second hole transport layer, a second emission layer, and a second electron transport layer, a third emission part on the second emission part, the third emission part including a third hole transport layer, a third emission layer, and a third electron transport layer, a first P-type charge generation layer between the first emission part and the second emission part, and a second P-type charge generation layer between the second emission part and the third emission part, wherein the organic light emitting display device includes a fourth hole transport layer on the third hole transport layer, and an absolute value of a highest occupied molecular orbitals (HOMO) energy level of the third hole transport layer and an absolute value of a HOMO energy level of the fourth hole transport layer are adjusted to be equal.

According to one or more embodiments of the present disclosure, the absolute value of the HOMO energy level of the third hole transport layer and the absolute value of the HOMO energy level of the fourth hole transport layer may each be greater than an absolute value of a lowest unoccupied molecular orbitals (LUMO) energy level of the second P-type charge generation layer.

According to one or more embodiments of the present disclosure, a difference between the absolute value of the HOMO energy level of the third hole transport layer and an absolute value of a lowest unoccupied molecular orbitals (LUMO) energy level of the second P-type charge generation layer may be within a range of approximately 0.1 eV to 0.3 eV, and a difference between the absolute value of the HOMO energy level of the fourth hole transport layer and the absolute value of the LUMO energy level of the second P-type charge generation layer may be within a range of approximately 0.1 eV to 0.3 eV.

According to one or more embodiments of the present disclosure, a hole mobility of the third hole transport layer may be higher than a hole mobility of the fourth hole transport layer.

According to one or more embodiments of the present disclosure, an absolute value of a triplet energy level of the fourth hole transport layer may be within a range of approximately 2.5 eV to 3.0 eV.

According to one or more embodiments of the present disclosure, the third hole transport layer may be disposed closer to the second P-type charge generation layer than the fourth hole transport layer.

According to one or more embodiments of the present disclosure, a ratio of a thickness of the third hole transport layer to a thickness of the fourth hole transport layer may be within a range of approximately 7:3 to 8:2.

According to one or more embodiments of the present disclosure, the second P-type charge generation layer may not include a dopant.

According to one or more embodiments of the present disclosure, the second hole transport layer may include a first material and a second material, an absolute value of a HOMO energy level of the first material is greater than an absolute value of a lowest unoccupied molecular orbitals (LUMO) energy level of the first P-type charge generation layer.

According to one or more embodiments of the present disclosure, a difference between the absolute value of the HOMO energy level of the first material and the absolute value of the LUMO energy level of the first P-type charge generation layer may be within a range of approximately 0.1 eV to 0.3 eV.

According to one or more embodiments of the present disclosure, a hole mobility of the second material may be within a range of approximately $1 \times 10^{-2}$ cm$^2$/Vs to $1 \times 10^{-4}$ cm$^2$/Vs.

According to one or more embodiments of the present disclosure, a volume ratio of the first material to the second material may be approximately 5:5.

According to one or more embodiments of the present disclosure, the first material and the second material may be mixed by co-deposition.

According to one or more embodiments of the present disclosure, the first P-type charge generation layer may not include a dopant.

The objects of the present disclosure are not limited to the aforesaid, but other objects not described herein will be clearly understood by those skilled in the art from descriptions above.

It will be apparent to those skilled in the art that various modifications and variations can be made in the present disclosure without departing from the spirit or scope of the disclosure. Thus, it is intended that the present disclosure covers the modifications and variations of this disclosure provided they come within the scope of the appended claims and their equivalents.

What is claimed is:

1. An organic light emitting display device comprising:
a first emission part including a first hole transport layer, a first emission layer, and a first electron transport layer;
a second emission part on the first emission part, the second emission part including a second hole transport layer, a second emission layer, and a second electron transport layer; and
a first P-type charge generation layer between the first emission part and the second emission part,
wherein:
the second hole transport layer and the first P-type charge generation layer are disposed adjacent to each other,
the second hole transport layer comprises a combination of a first material and a second material that have two kinds of characteristics and mixed in the second hole transport layer,
an absolute value of a highest occupied molecular orbitals (HOMO) energy level of the first material being greater than an absolute value of a lowest unoccupied molecular orbitals (LUMO) energy level of the first P-type charge generation layer,
the first P-type charge generation layer does not include a dopant,
a thickness of the second hole transport layer is within a range of 5 nm to 10 nm,
a hole mobility of one of the first material and the second material is higher than a hole mobility of the first P-type charge generation layer,
a hole mobility of the second material mixed with the first material in the second hole transport layer is within a range of approximately $1 \times 10^{-2}$ cm$^2$/Vs to $1 \times 10^{-4}$ cm$^2$/Vs, and
the first and second materials of the second hole transport layer include a starburst amine group.

2. The organic light emitting display device of claim 1, wherein a difference between the absolute value of the HOMO energy level of the second hole transport layer and the absolute value of the LUMO energy level of the first P-type charge generation layer is within a range of approximately 0.1 eV to 0.3 eV.

3. The organic light emitting display device of claim 1, wherein a volume ratio of the first material to the second material is approximately 5:5.

4. The organic light emitting display device of claim 1, wherein the second hole transport layer includes a mixture of the first material and the second material in a single layer, and
wherein an absolute value of a HOMO energy level of the second hole transport layer is within a range of approximately 5.4 eV to 5.6 eV.

5. The organic light emitting display device of claim 1, further comprising:
a third emission part on the second emission part, the third emission part including a third hole transport layer, a fourth hole transport layer, a third emission layer, and a third electron transport layer; and
a second P-type charge generation layer between the second emission part and the third emission part.

6. The organic light emitting display device of claim 5, wherein the second P-type charge generation layer does not include a dopant.

7. The organic light emitting display device of claim 5, wherein an absolute value of a HOMO energy level of the third hole transport layer and an absolute value of a HOMO energy level of the fourth hole transport layer each are greater than an absolute value of a LUMO energy level of the second P-type charge generation layer.

8. The organic light emitting display device of claim 5, wherein:
a difference between the absolute value of the HOMO energy level of the third hole transport layer and the absolute value of the LUMO energy level of the second P-type charge generation layer is within a range of approximately 0.1 eV to 0.3 eV, and
a difference between the absolute value of the HOMO energy level of the fourth hole transport layer and the absolute value of the LUMO energy level of the second P-type charge generation layer is within a range of approximately 0.1 eV to 0.3 eV.

9. The organic light emitting display device of claim 5, wherein an absolute value of a triplet energy level of the fourth hole transport layer is within a range of approximately 2.5 eV to 3.0 eV.

10. The organic light emit display device of claim 5, wherein a hole mobility of the third hole transport layer is higher than a hole mobility of the fourth hole transport layer.

11. The organic light emitting display device of claim 5, wherein the third hole transport layer is disposed closer to the second P-type charge generation layer than the fourth hole transport layer.

12. The organic light emitting display device of claim 5, wherein a ratio of a thickness of the third hole transport layer to a thickness of the fourth hole transport layer is within a range of approximately 7:3 to 8:2.

13. An organic light witting display device comprising:
a first emission part including a first hole transport layer, a first emission layer, and a first electron transport layer;
a second emission part on the first emission part, the second emission part including a second hole transport layer, a second emission layer, and a second electron transport layer, the second hole transport layer comprising a combination of a first material and a second material that have two kinds of characteristics and mixed in the second hole transport layer;
a third emission part on the second emission part, the third emission part including a third hole transport layer, a third emission layer, and a third electron transport layer;
a first P-type charge generation layer between the first emission part and the second emission part; and
a second P-type charge generation layer between the second emission part and the third emission part,
wherein:
the organic light emitting display device comprises a fourth hole transport layer on the third hole transport layer,
an absolute value of a highest occupied molecular orbitals (HOMO) energy level of the third hole transport layer and an absolute value of a HOMO energy level of the fourth hole transport layer are equal,
the first P-type charge generation layer does not include a dopant,
a thickness of the second hole transport layer is within a range of 5 nm to 10 nm,
a hole mobility of one of the first material and the second material is higher than a hole mobility of the first P-type charge generation layer,
a hole mobility of the second material mixed with the first material in the second hole transport layer is within a range of approximately $1 \times 10^{-2}$ cm$^2$/Vs to $1 \times 10^{-4}$ cm$^2$/Vs, and the first and second materials of the second hole transport layer include a starburst amine group.

14. The organic light emitting display device of claim 13, wherein the absolute value of the HOMO energy level of the third hole transport layer and the absolute value of the HOMO energy level of the fourth hole transport layer each are greater than an absolute value of a lowest unoccupied molecular orbitals (LUMO) energy level of the second P-type charge generation layer.

15. The organic light emitting display device of claim 13, wherein:
- a difference between the absolute value of the HOMO energy level of the third hole transport layer and an absolute value of a lowest unoccupied molecular orbitals (LUMO) energy level of the second P-type charge generation layer is within a range of 0.1 eV to 0.3 eV, and
- a difference between the absolute value of the HOMO energy level of the fourth hole transport layer and the absolute value of the LUMO energy level of the second P-type charge generation layer is within a range of approximately 0.1 eV to 0.3 eV.

16. The organic light emitting display device of claim 13, wherein a hole mobility of the third hole transport layer is higher than a hole mobility of the fourth hole transport layer.

17. The organic light emitting display device of claim 13, wherein an absolute value of a triplet energy level of the fourth hole transport layer is within a range of approximately 2.5 eV to 3.0 eV.

18. The organic light emitting display device of claim 13, wherein the third hole transport layer is disposed closer to the second P-type charge generation layer than the fourth hole transport layer.

19. The organic light emitting display device of claim 13, wherein a ratio of a thickness of the third hole transport layer to a thickness of the fourth hole transport layer is within a range of approximately 7:3 to 8:2.

20. The organic light emitting display device of claim 13, wherein the second P-type charge generation layer does not include a dopant.

21. The organic light emitting display device of claim 13, wherein an absolute value of a HOMO energy level of the first material is greater than an absolute value of a lowest unoccupied molecular orbitals (LUMO) energy level of the first P-type charge generation layer.

22. The organic light emitting display device of claim 21, wherein a difference between the absolute value of the HOMO energy level of the second hole transport layer and the absolute value of the LUMO energy level of the first P-type charge generation layer is within a range of approximately 0.1 eV to 0.3 eV.

23. The organic light emitting display device of claim 21, wherein a volume ratio of the first material to the second material is approximately 5:5.

24. The organic light emitting display device of claim 21, wherein the second hole transport layer includes a mixture of the first material and the second material in a single layer, and
- wherein an absolute value of a HOMO energy level of the second hole transport layer is within a range of approximately 5.4 eV to 5.6 eV.

25. The organic light emitting display device of claim 1, further comprising:
- a third emission part on the second emission part, the third emission part including a third hole transport layer, a fourth hole transport layer, a third emission layer, and a third electron transport layer; and
- a second P-type charge generation layer between the second emission part and the third emission part.

26. The organic light emitting display device of claim 25, wherein the second P-type charge generation layer does not include a dopant.

27. The organic light emitting display device of claim 1, wherein the absolute value of the LUMO energy level of the first P-type charge generation layer is within a range of approximately 5.3 eV to 5.5 eV.

28. The organic light emitting display device of claim 13, wherein an absolute value of a lowest unoccupied molecular orbitals (LUMO) energy level of the first P-type charge generation layer is within a range of approximately 5.3 eV to 5.5 eV.

29. The organic light emitting display device of claim 1, wherein the thickness of the second hole transport layer is about 5 nm.

30. The organic light emitting display device of claim 13, wherein the thickness of the second hole transport layer is about 5 nm.

* * * * *